US012614850B2

(12) United States Patent
Lee et al.

(10) Patent No.:  US 12,614,850 B2
(45) Date of Patent:      Apr. 28, 2026

(54) SEMICONDUCTOR PACKAGE INCLUDING ANTENNA AND METHOD OF MANUFACTURING THE SEMICONDUCTOR PACKAGE

(71) Applicant: NEPES CO., LTD., Eumseong-gun (KR)

(72) Inventors: Jung Won Lee, Eumseong-gun (KR); Ju Eok Park, Eumseong-gun (KR); In Soo Kang, Eumseong-gun (KR)

(73) Assignee: NEPES CO., LTD., Eumseong-gun (KR)

( * ) Notice: Subject to any disclaimer, the term of this patent is extended or adjusted under 35 U.S.C. 154(b) by 559 days.

(21) Appl. No.: 18/145,047

(22) Filed: Dec. 22, 2022

(65) Prior Publication Data

US 2023/0216201 A1     Jul. 6, 2023

(30) Foreign Application Priority Data

Jan. 4, 2022    (KR) ........................ 10-2022-0001033
Sep. 29, 2022    (KR) ........................ 10-2022-0124651

(51) Int. Cl.
H01L 23/48          (2006.01)
H01L 21/48          (2006.01)
(Continued)

(52) U.S. Cl.
CPC ....... H01Q 9/0407 (2013.01); H01L 21/4857 (2013.01); H01L 21/563 (2013.01);
(Continued)

(58) Field of Classification Search
CPC . H01Q 9/0407; H01L 21/4857; H01L 21/563; H01L 23/3128; H01L 23/49811; H01L 23/49822; H01L 24/16
See application file for complete search history.

(56) References Cited

U.S. PATENT DOCUMENTS

2020/0058606 A1*   2/2020   Tsai ...................... H01L 23/481
2020/0321293 A1*  10/2020   Kim ........................ H01L 24/83

FOREIGN PATENT DOCUMENTS

CN         110890352 A      3/2020
JP       2021-141370 A      9/2021
(Continued)

OTHER PUBLICATIONS

A communication of office Action of Korean Patent Application No. 10-2022-0001033 issued on Dec. 20, 2023, and Korean Patent Application No. 10-2022-0124651 issued on Feb. 1, 2024 which corresponds to this application.

(Continued)

*Primary Examiner* — Nicholas J Tobergte
(74) *Attorney, Agent, or Firm* — Harvest IP LAW LLP

(57)                ABSTRACT

A semiconductor package includes: a lower package; and an upper package stacked on the lower package, wherein the lower package includes: a first redistribution structure; a semiconductor chip mounted on the first redistribution structure; a first molding layer surrounding the semiconductor chip on the first redistribution structure; and first vertical connection conductors disposed on the first redistribution structure and vertically passing through the first molding layer, wherein the upper package includes: a second molding layer disposed on the lower package; second vertical connection conductors vertically passing through the second molding layer and electrically connected to the first vertical connection conductors; and an antenna structure disposed on the second molding layer.

19 Claims, 33 Drawing Sheets

(51) Int. Cl.

| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 25/16* | (2023.01) |
| *H01Q 1/48* | (2006.01) |
| *H01Q 9/04* | (2006.01) |
| *H01Q 1/52* | (2006.01) |

(52) U.S. Cl.

CPC .... *H01L 23/3128* (2013.01); *H01L 23/49811* (2013.01); *H01L 23/49822* (2013.01); *H01L 24/16* (2013.01); *H01L 25/165* (2013.01); *H01Q 1/48* (2013.01); *H01L 2224/16227* (2013.01); *H01Q 1/526* (2013.01)

(56) References Cited

FOREIGN PATENT DOCUMENTS

| | | | |
|---|---|---|---|
| KR | 10-2015-0025633 | A | 3/2015 |
| KR | 10-2019-0088213 | A | 7/2019 |
| KR | 10-2020-0012440 | A | 2/2020 |
| KR | 10-2020-0020632 | A | 2/2020 |
| KR | 10-2020-0073572 | A | 6/2020 |
| KR | 10-2020-0076379 | A | 6/2020 |
| KR | 10-2020-0117399 | A | 10/2020 |
| KR | 10-2021-0000391 | A | 1/2021 |
| KR | 10-2022-0093508 | A | 7/2022 |
| TW | 201104770 | A | 2/2011 |
| TW | 201903994 | A | 1/2019 |
| TW | 202042357 | A | 11/2020 |
| TW | 202105635 | A | 2/2021 |
| TW | 202143406 | A | 11/2021 |

OTHER PUBLICATIONS

TW OA issued on Oct. 12, 2023.

\* cited by examiner

FIG. 17

SEMICONDUCTOR PACKAGE INCLUDING ANTENNA AND METHOD OF MANUFACTURING THE SEMICONDUCTOR PACKAGE

CROSS-REFERENCE TO RELATED APPLICATIONS

This application is based on and claims priority under 35 U.S.C. § 119 to Korean Patent Application Nos. 10-2022-0001033, filed on Jan. 4, 2022, and 10-2022-0124651, filed on Sep. 29, 2022, in the Korean Intellectual Property Office, the disclosures of which are incorporated by reference herein in their entireties.

BACKGROUND

1. Field

The inventive concept of the disclosure relates to a semiconductor package and a method of manufacturing the semiconductor package, and more particularly, to a semiconductor package including an antenna for transmitting and receiving a radio signal and a method of manufacturing the semiconductor package.

2. Description of the Related Art

In electronic devices, integrated circuits are widely used due to their advantages of small size, light weight, high reliability, and easy mass production. An integrated circuit package device may integrate all components required by a circuit having a certain function into one chip and package the chip on a package substrate. The components may include element, such as semiconductors, resistors, and capacitors, and connecting wires between the elements. When the chip needs to receive or transmit radio signals, an antenna may be placed in the integrated circuit packaged device.

SUMMARY

The inventive concept of the disclosure provides a semiconductor package including an antenna and a method of manufacturing the semiconductor package.

Additional aspects will be set forth in part in the description which follows and, in part, will be apparent from the description, or may be learned by practice of the presented embodiments of the disclosure.

According to an aspect of the inventive concept of the disclosure, there is provided a semiconductor package including: a lower package; and a first upper package stacked on the lower package, wherein the lower package includes: a first redistribution structure including a first redistribution insulating layer and a first conductive layer; a semiconductor chip mounted on the first redistribution structure; a first molding layer surrounding the semiconductor chip on the first redistribution structure; and first vertical connection conductors disposed on the first redistribution structure and vertically passing through the first molding layer, wherein the first upper package includes: a second molding layer disposed on the lower package; second vertical connection conductors vertically passing through the second molding layer and electrically connected to the first vertical connection conductors; and a first antenna structure disposed on the second molding layer, wherein the first antenna structure includes: a dielectric layer; active antenna patterns disposed between the dielectric layer and the second molding layer and electrically connected to the second vertical connection conductors; and parasitic antenna patterns on the dielectric layer, and wherein an antenna ground conductive layer electrically grounded is disposed between the lower package and the second molding layer, a distance in a vertical direction between each of the active antenna patterns and the antenna ground conductive layer is between 100 micrometers and 600 micrometers, and a thickness of the second molding layer in the vertical direction is between 50 micrometers and 400 micrometers.

According to an aspect of the inventive concept of the disclosure, there is provided a semiconductor package including: an antenna structure including a dielectric layer and an active antenna pattern on a first surface of the dielectric layer; a gapping insulating layer provided on the first surface of the dielectric layer; a lower vertical connection conductor passing through the gapping insulating layer and electrically connected to the active antenna pattern; a first redistribution structure provided on the gapping insulation layer and including a first conductive layer electrically connected to the active antenna pattern through the lower vertical connection conductor and an antenna ground layer electrically grounded; a semiconductor chip mounted on the first redistribution structure and electrically connected to the active antenna pattern through the first conductive layer and the lower vertical connection conductor; a molding layer provided on the first redistribution structure and surrounding a side surface of the semiconductor chip; upper vertical connection conductors spaced apart from the semiconductor chip in a lateral direction and passing through the molding layer; and a second redistribution structure provided on the molding layer and the semiconductor chip and including a second conductive layer connected to the upper vertical connection conductors.

According to an aspect of the inventive concept of the disclosure, there is provided a method of manufacturing a semiconductor package, the method including: forming a panel-shaped lower structure; preparing an upper package including an antenna structure, and stacking the upper package on the panel-shaped lower structure; and separating the panel-shaped lower structure into a plurality of lower packages, wherein the forming of the a panel-shaped lower structure includes: forming a first redistribution structure including a first redistribution insulating layer and a first conductive layer; mounting a semiconductor chip on the first redistribution structure; forming first vertical connection conductors electrically connected to the first conductive layer on the first redistribution structure; and forming a first molding layer on the first redistribution structure to cover a side surface of the semiconductor chip and side surfaces of the first vertical connection conductors.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 17 is a cross-sectional view illustrating a semiconductor package according to some embodiments;

DETAILED DESCRIPTION

Figure 1:
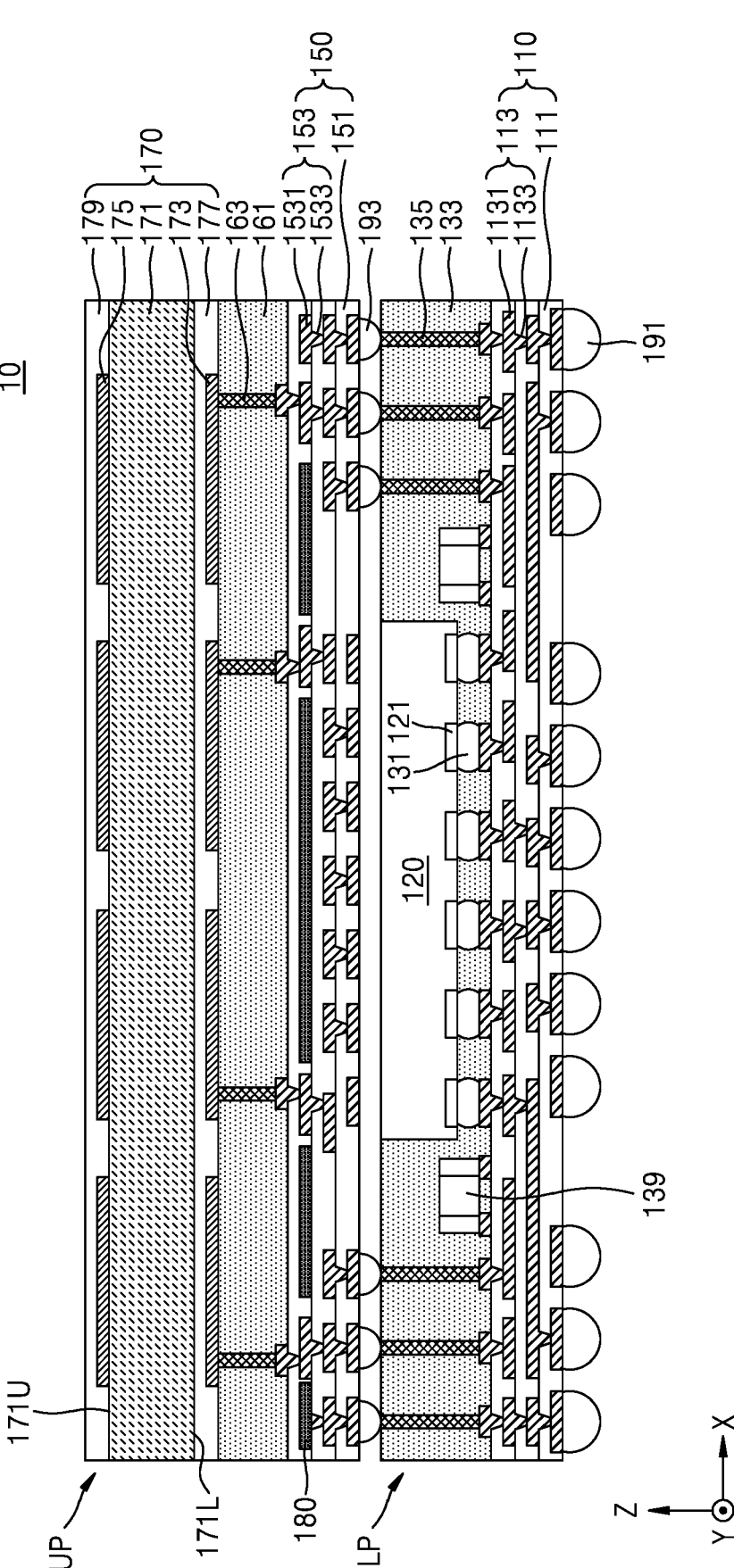
FIG. 1 is a cross-sectional view illustrating a semiconductor package according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept of the disclosure will be described in detail with reference to the accompanying drawings. The same reference numerals are used for the same elements in the drawings, and duplicate descriptions thereof are omitted.

FIG. 1 is a cross-sectional view illustrating a semiconductor package 10 according to some embodiments.

Referring to FIG. 1, the semiconductor package 10 may include a lower package LP and an upper package UP. The upper package UP may be stacked on the lower package LP through inter-package connection terminals 193. In some embodiments, one upper package UP or a plurality of upper packages UP spaced apart from each other in a lateral direction on the lower package LP may be disposed on the lower package LP.

The lower package LP may include a first redistribution structure 110, a semiconductor chip 120, a first molding layer 133, and a plurality of first vertical connection conductors 135.

The first redistribution structure 110 may be a mounting substrate on which the semiconductor chip 120 is mounted. The first redistribution structure 110 may include a plurality of first redistribution insulating layers 111 and a first conductive connection structure 113.

The plurality of first redistribution insulating layers 111 may be mutually stacked in a vertical direction (e.g., a Z direction). The plurality of first redistribution insulating layers 111 may include insulating polymer, epoxy, or a combination thereof.

The first conductive connection structure 113 may include first conductive layers 1131 each disposed on one of upper and lower surfaces of each of the plurality of first redistribution insulating layers 111, and first conductive via patterns 1133 extending in the vertical direction (e.g., the Z direction) through at least one of the plurality of first redistribution insulating layers 111. The first conductive layers 1131 may be disposed at different vertical levels to form a multilayer structure. Each of the first conductive layers 1131 may include a line pattern extending in a line shape along one of the upper and lower surfaces of each of the plurality of first redistribution insulating layers 111. The uppermost first conductive layer 1131 provided on the uppermost insulating layer among the plurality of first redistribution insulating layers 111 may include first upper pads to which chip connection bumps 131 for electrical connection with the semiconductor chip 120 are attached, and second upper pads to which the first vertical connection conductors 135 are connected. The lowermost first conductive layer 1131 provided on the lowermost insulating layer among the plurality of first redistribution insulating layers 111 may include external pads to which external connection terminals 191 are attached. For example, the external connection terminals 191 may be formed from solder balls or solder bumps. The first conductive via patterns 1133 may electrically connect the first conductive layers 1131 disposed at different vertical levels.

The semiconductor chip 120 may be disposed on the first redistribution structure 110. In some embodiments, the semiconductor chip 120 may be mounted on the first redistribution structure 110 in a flip chip manner. The semiconductor chip 120 may include an upper surface and a lower surface, which are opposite to each other, and the lower surface of the semiconductor chip 120 may be a pad surface on which chip pads 121 are provided. The chip connection bumps 131 such as micro bumps may be disposed between the semiconductor chip 120 and the first redistribution structure 110. Each of the chip connection bumps 131 may be connected to a corresponding chip pad 121 of the semiconductor chip 120 and a corresponding first upper pad of the first redistribution structure 110. The semiconductor chip 120 may be electrically connected to the first conductive connection structure 113 of the first redistribution structure 110 through the chip connection bumps 131.

A plurality of individual elements of various types may be formed in the semiconductor chip 120. For example, the plurality of individual elements may include various microelectronic elements, for example, a metal-oxide-semiconductor field effect transistor (MOSFET) such as a complementary metal-oxide-semiconductor (CMOS) transistor, a system large scale integration (LSI), an image sensor such as a CMOS imaging sensor (CIS), a micro-electro-mechanical system (MEMS), a power management (PM) IC, an active element, a passive element, and the like.

In some embodiments, the semiconductor chip 120 is a communication semiconductor chip 120 electrically or signal-transmissibly connected to an antenna structure 170 of the upper package UP to be described below, and may include a signal processing circuit for processing a radio signal transmitted or received through the antenna structure 170. For example, the semiconductor chip 120 may include a radio-frequency integrated circuit (RFIC) chip.

In some embodiments, the semiconductor chip 120 may be, for example, a memory chip. The memory chip may be, for example, a volatile memory chip, such as dynamic random access memory (DRAM) or static random access memory (SRAM), or a non-volatile memory chip, such as phase-change random access memory (PRAM), magnetoresistive random access memory (MRAM), ferroelectric random access memory (FeRAM), or resistive random access memory (RRAM).

Alternatively, in some embodiments, the semiconductor chip 120 may be a logic chip. For example, the semiconductor chip 120 may be a central processor unit (CPU), a micro processor unit (MPU), a graphic processor unit (GPU), or an application processor (AP).

The semiconductor package 10 may include one semiconductor chip 120 or may include two or more semiconductor chips 120. The two or more semiconductor chips 120 included in the semiconductor package 10 may be semiconductor chips of the same type or semiconductor chips of different types. In some embodiments, the semiconductor package 10 may be a system in package in which different types of semiconductor chips 120 and various electronic components are electrically connected to each other to operate as a system.

In some embodiments, a passive component 139 may be mounted on the first redistribution structure 110. The passive component 139 may be spaced apart from the semiconductor chip 120 in the lateral direction. The passive component 139 may include a capacitor, an inductor, a resistor, an integrated passive device (IPD), and the like.

The first molding layer 133 may be provided on the first redistribution structure 110 and may cover the upper surface of the first redistribution structure 110. The first molding layer 133 may cover at least a portion of the semiconductor chip 120. In some embodiments, the first molding layer 133 may cover the side surface of the semiconductor chip 120 but may not cover the upper surface of the semiconductor chip 120. In this case, the upper surface of the first molding layer 133 may be conpinar with the upper surface of the semiconductor chip 120. The upper surface of the semiconductor chip 120 may be exposed without being covered by the upper surface of the first molding layer 133 and may be exposed to a space (or gap) between the lower package LP and the upper package UP. In other embodiments, the first molding layer 133 may cover both the upper and side surfaces of the semiconductor chip 120. In some embodiments, the first molding layer 133 may fill a gap between the semiconductor chip 120 and the first redistribution structure 110 and may surround the chip connection bump 131 between the semiconductor chip 120 and the first redistribution structure 110. The first molding layer 133 may include, for example, an epoxy molding compound, but is not limited thereto.

In some embodiments, the thickness of the first molding layer 133 may be between 100 micrometers and 500 micrometers, between 150 micrometers and 450 micrometers, or between 200 micrometers and 400 micrometers.

The plurality of first vertical connection conductors 135 may be provided in the first molding layer 133 and may be spaced apart from the semiconductor chip 120 in the lateral direction. The first vertical connection conductors 135 may extend in a substantially vertical direction (e.g., the Z direction) within the first molding layer 133 and may pass through the first molding layer 133. The first vertical connection conductors 135 may each have a pillar shape extending in the vertical direction (e.g., the Z direction) within the first molding layer 133. The lower surfaces of the first vertical connection conductors 135 may respectively contact the second upper pads of the first redistribution structure 110, and the upper surfaces of the first vertical connection conductors 135 may respectively contact the inter-package connection terminals 193.

For example, each of the first vertical connection conductors 135 may include copper (Cu), aluminum (Al), solder, tin (Sn), zinc (Zn), lead (Pb), silver (Ag), gold (Au), palladium (Pd), or a combination thereof.

In some embodiments, the diameter (or maximum width in a horizontal direction) of the first vertical connection conductor 135 may be between 20 micrometers and 50 micrometers.

In some embodiments, the first vertical connection conductor 135 may be a conductive post formed through a plating process and including Cu.

In some embodiments, the first vertical connection conductor 135 may include a conductive wire formed through a bonding wire process. For example, when the first vertical connection conductor 135 includes a conductive wire, an operation of forming a conductive wire on the second upper pads of the first redistribution structure 110 through a bonding wire process, a molding operation of forming a molding material constituting the first molding layer 133 covering the semiconductor chip 120 and the conductive wire, and a polishing operation of removing a portion of the molding material to expose the conductive wire may be sequentially performed.

In some embodiments, the plurality of first vertical connection conductors 135 may include one or more vertical connection conductors for signal transmission configured to transmit an input signal input to the semiconductor chip 120 or an output signal output from the semiconductor chip 120, and one or more vertical connection conductors for electromagnetic interference (EMI) shielding configured to shield EMI to the semiconductor chip 120. The one or more vertical connection conductors for signal transmission may be configured to transmit a data signal, a control signal, a power signal, and/or a ground signal transmitted to the semiconductor chip 120, or may be configured to transmit an output signal output from the semiconductor chip 120. The one or more vertical connection conductors for EMI shielding may be electrically grounded. For example, in a plan view, a plurality of vertical connection conductors for EMI shielding may be arranged to surround the semiconductor chip 120 and shield EMI between the semiconductor chip 120 and the external environment. In some embodiments, the arrangement (e.g., pitch interval, etc.) of the plurality of first vertical connection conductors 135 may be determined according to a frequency band supported by the semiconductor chip 120. In some embodiments, each of the vertical connection conductors for EMI shielding may be a dummy structure that is not connected to the first conductive connection structure 113.

The upper package UP may be stacked on the lower package LP and may include a second redistribution structure 150, a second molding layer 161, a plurality of second vertical connection conductors 163, and an antenna structure 170. In some embodiments, a footprint of the upper package UP may be the same as or similar to that of the lower package LP, and when viewed in a cross-section, the horizontal width of the upper package UP may be substantially the same as or similar to that of the lower package LP.

The second redistribution structure 150 may be disposed on the lower package LP. The second redistribution structure 150 may include a plurality of second redistribution insulating layers 151 and a second conductive connection structure 153.

The plurality of second redistribution insulating layers 151 may be mutually stacked in the vertical direction (e.g., the Z direction). The plurality of second redistribution insulating layers 151 may include insulating polymer, epoxy, or a combination thereof.

The second conductive connection structure 153 may include second conductive layers 1531 each disposed on one of the upper and lower surfaces of each of the plurality of second redistribution insulating layers 151, and second conductive via patterns 1533 extending in the vertical direction (e.g., the Z direction) through at least one of the plurality of second redistribution insulating layers 151. The second conductive layers 1531 may be disposed at different vertical levels to form a multilayer structure. Each of the second conductive layers 1531 may include a line pattern extending in a line shape along one of the upper and lower surfaces of each of the plurality of second redistribution insulating layers 151. The uppermost second conductive layer 1531 provided on the uppermost insulating layer among the plurality of second redistribution insulating layers 151 may include upper pads to which the second vertical connection conductors 163 are attached. The lowermost second conductive layer 1531 provided on the lowermost insulating layer among the plurality of second redistribution insulating layers 151 may include lower pads to which the inter-package connection terminals 193 are attached. The second conductive via patterns 1533 may electrically connect the second conductive layers 1531 disposed at different vertical levels.

The second molding layer 161 is provided on the second redistribution structure 150 and may cover an upper surface of the second redistribution structure 150. The second molding layer 161 may include, for example, an epoxy molding compound, but is not limited thereto.

In some embodiments, the thickness of the second molding layer 161 may be between 50 micrometers and 400 micrometers, between 100 micrometers and 300 micrometers, or between 150 micrometers and 250 micrometers.

The plurality of second vertical connection conductors 163 may be disposed in the second molding layer 161. The second vertical connection conductors 163 may extend in a substantially vertical direction (e.g., the Z direction) within the second molding layer 161 and may pass through the second molding layer 161. The second vertical connection conductors 163 may be electrically connected to the first vertical connection conductors 135 through the second conductive connection structure 153 and the inter-package connection terminals 193. Each of the second vertical connection conductors 163 may have a pillar shape extending in the vertical direction (e.g., the Z direction) within the second molding layer 161. The lower surfaces of the second vertical connection conductors 163 may respectively contact the upper pads of the second redistribution structure 150, and the upper surfaces of the second vertical connection conductors 163 may contact the antenna structure 170. The material, diameter, and formation of the second vertical connection conductor 163 are substantially the same as or similar to those of the first vertical connection conductor 135 described above, and thus, descriptions thereof are omitted here.

The antenna structure 170 may be disposed on the second molding layer 161 and may cover the upper surface of the second molding layer 161. The antenna structure 170 may include antenna patterns electrically connected to the semiconductor chip 120. The antenna structure 170 may include a dielectric layer 171, an active antenna pattern 173, and a parasitic antenna pattern 175.

The dielectric layer 171 may include a first surface 171L and a second surface 171U, which are opposite to each other. The dielectric layer 171 may have a substantially flat plate shape, and the first surface 171L and the second surface 171U may be planar. The first surface 171L and the second surface 171U of the dielectric layer 171 may be parallel to each other. In the present specification, the horizontal direction may be defined as a direction (e.g., an X direction and/or a Y direction) parallel to the first surface 171L or the second surface 171U of the dielectric layer 171, and the vertical direction may be defined as a direction (e.g., the Z direction) perpendicular to the first surface 171L or the second surface 171U of the dielectric layer 171. In addition, the horizontal width may be defined as a length in the horizontal direction (e.g., the X direction and/or the Y direction), and the thickness or vertical distance may be defined as a length in the vertical direction (e.g., the Z direction).

For example, the dielectric layer 171 may include at least one material selected from among a thermosetting resin such as epoxy resin, a thermoplastic resin such as polyimide, a resin in which the thermosetting and thermoplastic resins are impregnated into glass fibers together with an inorganic filler, prepreg, Ajinomoto build-up film (ABF), FR-4, bismaleimide triazine (BT), and photo imagable dielectric (PID).

The dielectric layer 171 may have low dielectric constant and low dissipation factor characteristics. For example, the dielectric constant of the dielectric layer 171 may be 4 or less, 3.5 or less, 3 or less, or 2.5 or less. For example, the dissipation factor of the dielectric layer 171 may be 0.009 or less, 0.007 or less, 0.005 or less, or 0.003 or less.

In some embodiments, each of the plurality of first redistribution insulating layers 111 may include a material different from a material constituting the dielectric layer 171. In some embodiments, the dielectric constant of each of the plurality of first redistribution insulating layers 111 may be different from that of the dielectric layer 171. In some embodiments, each of the plurality of second redistribution insulating layers 151 may include a material different from the material constituting the dielectric layer 171. In some embodiments, the dielectric constant of each of the plurality of second redistribution insulating layers 151 may be different from that of the dielectric layer 171.

In some embodiments, the thickness of the dielectric layer 171 may be between 100 micrometers and 300 micrometers, or between 150 micrometers and 250 micrometers. In some embodiments, the thickness of the dielectric layer 171 may be 200 micrometers.

The antenna structure 170 may include a lower cover insulating layer 177 covering the first surface 171L of the dielectric layer 171. In this case, the dielectric layer 171 and the second molding layer 161 may be spaced apart from each other with the lower cover insulating layer 177 therebetween.

The active antenna pattern 173 may be disposed on the side of the first surface 171L of the dielectric layer 171 facing the second molding layer 161. In some embodiments, the active antenna pattern 173 may extend along the upper surface of the second molding layer 161 and may contact the upper surface of the second molding layer 161. The lower cover insulating layer 177 may cover the upper surfaces of the active antenna pattern 173 and the second molding layer 161. In some embodiments, the active antenna pattern 173 may extend along the first surface 171L of the dielectric layer 171 and may contact the first surface 171L of the dielectric layer 171. In some embodiments, the active antenna pattern 173 may be at least partially buried in the dielectric layer 171.

In some embodiments, the active antenna pattern 173 may be electrically connected to the semiconductor chip 120 through a signal transmission path including the second vertical connection conductor 163, the second conductive connection structure 153 of the second redistribution structure 150, the inter-package connection terminal 193, the first vertical connection conductor 135, the first conductive connection structure 113 of the first redistribution structure 110, and the chip connection bump 131.

In some embodiments, the active antenna pattern 173 may have a structure and shape suitable for performing communication in a predetermined wavelength band. In some embodiments, the active antenna pattern 173 may be configured to radiate or receive a radio signal in a millimeter wavelength band. The active antenna pattern 173 may function as a radiator of an antenna and/or a director of an antenna. For example, the active antenna pattern 173 may include a patch antenna or a dipole antenna.

In some embodiments, the interval between two neighboring active antenna patterns 173 may be between 10% and 400%, between 30% and 300%, or between 50% and 150% of the horizontal width of the active antenna pattern 173. In some embodiments, the interval between two neighboring active antenna patterns 173 may be equal to the horizontal width of the active antenna pattern 173.

In some embodiments, the active antenna pattern 173 may include at least one first active antenna pattern 173 configured to radiate or receive a radio signal in a first wavelength band, and at least one second active antenna pattern 173 configured to radiate or receive a radio signal in a second wavelength band different from the first wavelength band. The at least one first active antenna pattern 173 and the at least one second active antenna pattern 173 may be electrically connected to the semiconductor chip 120 through different electrical connection paths. The at least one first active antenna pattern 173 and the at least one second active antenna pattern 173 may have different shapes and/or different dimensions (e.g., different horizontal widths).

The parasitic antenna pattern 175 may be disposed on the second surface 171U of the dielectric layer 171. For example, the parasitic antenna pattern 175 may extend the bandwidth of wireless communication using the active antenna pattern 173. The parasitic antenna pattern 175 may be spaced apart from the active antenna pattern 173 in the vertical direction (e.g., the Z direction) with the dielectric layer 171 therebetween. The parasitic antenna pattern 175 may be a patch antenna having a polygonal shape such as a circle or a quadrangle in a plan view, or may have a line shape formed on the second surface 171U of the dielectric layer 171. The antenna structure 170 may further include an upper cover insulating layer 179 covering the second surface 171U of the dielectric layer 171 and the parasitic antenna pattern 175.

In some embodiments, the parasitic antenna pattern 175 may have the same shape as the active antenna pattern 173 in a plan view, and the parasitic antenna pattern 175 and the active antenna pattern 173 may overlap each other in a plan view. In other embodiments, the shape of the parasitic antenna pattern 175 may be different from the shape of the active antenna pattern 173.

In some embodiments, the parasitic antenna pattern 175 may be exposed to the outside. For example, the upper cover insulating layer 179 may be omitted so that the parasitic antenna pattern 175 is exposed to the outside. In some embodiments, the upper cover insulating layer 179 may be omitted, and the parasitic antenna pattern 175 may be at least partially buried in the dielectric layer 171. The parasitic antenna pattern 175 may be partially buried in the dielectric layer 171, but a portion of the parasitic antenna pattern 175 may be exposed to the outside. For example, the lower surface of the parasitic antenna pattern 175 may be exposed to the outside.

The active antenna pattern 173 and the parasitic antenna pattern 175 may include a conductive material. For example, the active antenna pattern 173 and the parasitic antenna pattern 175 may include a metal such as Cu or Al.

An antenna ground conductive layer 180 may be disposed between each of the active antenna patterns 173 of the antenna structure 170 and the lower package LP. The antenna ground conductive layer 180 may have a plane or flat plate shape extending substantially parallel to an XY plane.

In some embodiments, the antenna ground conductive layer 180 may be provided within the second redistribution structure 150. In some embodiments, the antenna ground conductive layer 180 may be buried in the second redistribution structure 150. The antenna ground conductive layer 180 may have a plane or flat plate shape extending along the surface of any one of the plurality of second redistribution insulating layers 151. The antenna ground conductive layer 180 may be at the same vertical level as any one of the second conductive layers 1531. The antenna ground conductive layer 180 may be formed together with the second conductive layers 1531. For example, the antenna ground conductive layer 180 may extend along the upper surface of any one insulating layer 111 of the plurality of second redistribution insulating layers 151. The antenna ground conductive layer 180 may be substantially parallel to each of the active antenna patterns 173, and capacitance may be formed between the antenna ground conductive layer 180 and the active antenna patterns 173. As shown in the cross-sectional view of FIG. 1, the horizontal width of the antenna ground conductive layer 180 may be greater than the horizontal width of each of the active antenna patterns 173. For example, in a plan view, an area where the antenna ground conductive layer 180 is disposed may be larger than an area where the active antenna patterns 173 are disposed. For example, in a plan view, an area including all of the active antenna patterns 173 may be within an area including the antenna ground conductive layer 180.

The antenna ground conductive layer 180 may be electrically grounded. For example, the antenna ground conductive layer 180 may be configured to receive a ground signal through an external connection terminal 191 to which a ground signal (or ground voltage) provided from the outside is applied, the first conductive connection structure 113, the first vertical connection conductor 135, and the second conductive connection structure 153.

The size of the antenna ground conductive layer 180, the vertical distance between the antenna ground conductive layer 180 and the active antenna pattern 173, and the dielectric constant of each of the materials provided between the antenna ground conductive layer 180 and the active antenna pattern 173 may affect antenna radiation characteristics using the antenna structure 170.

In some embodiments, the vertical distance between each of the active antenna patterns 173 and the antenna ground conductive layer 180 may be between 100 micrometers and 600 micrometers, between 200 micrometers and 500 micrometers, or between 300 micrometers and 400 micrometers.

In some embodiments, in order to adjust antenna radiation characteristics, the dielectric constant of material(s) provided between the antenna ground conductive layer 180 and the active antenna pattern 173 may be adjusted. For example, in order to adjust antenna radiation characteristics, the dielectric constant of the first redistribution insulating layer 111, the dielectric constant of the first molding layer 133, the dielectric constant of the second redistribution insulating layer 151, and/or the dielectric constant of the second molding layer 161 may be adjusted.

In other embodiments, the antenna ground conductive layer 180 may be disposed within the first redistribution structure 110. In this case, the antenna ground conductive layer 180 may extend along the surface of any one of the plurality of first redistribution insulating layers 111, may be at the same vertical level as any one of the first conductive layers 1131, and may be formed together with any one of the first conductive layers 1131 through the same plating process.

According to some embodiments of the disclosure, because the semiconductor chip 120 and the antenna structure 170 are packaged in one package, an antenna and the semiconductor chip 120 may be connected to each other through a relatively short signal path, and the miniaturization of the semiconductor package 10 including the antenna may be achieved.

FIGS. 2A to 2D are cross-sectional views illustrating a method of manufacturing the upper package UP of the semiconductor package 10 shown in FIG. 1. Hereinafter, the method of manufacturing the upper package UP of the semiconductor package 10 illustrated in FIG. 1 will be described with reference to FIGS. 2A to 2D.

Figure 2A:
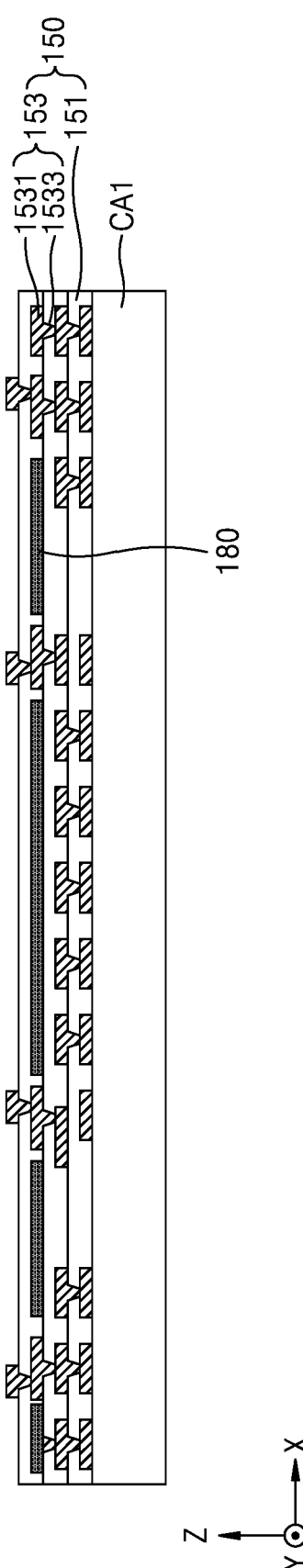
FIGS. 2A to 2D are cross-sectional views illustrating a method of manufacturing an upper package of the semiconductor package shown in FIG. 1.

Referring to FIG. 2A, a carrier substrate CA1 is prepared. The carrier substrate CA1 may have a flat plate shape. In a plan view, the carrier substrate CA1 may have a circular shape or a polygonal shape such as a quadrangle. The carrier substrate CA1 may be, for example, a semiconductor substrate, a glass substrate, a ceramic substrate, or a plastic substrate.

Next, a second redistribution structure 150 including a plurality of second redistribution insulating layers 151 and a second conductive connection structure 153 is formed on the carrier substrate CA1. Each of the plurality of second redistribution insulating layers 151 may be formed through forming an insulating layer through a lamination process and forming via holes in the insulating layer through a patterning process for the insulating layer. Second conductive layers 1531 and second conductive via patterns 1533, which constitute the second conductive connection structure 153, may be formed through a plating process. In some embodiments, the second redistribution structure 150 may further include an antenna ground conductive layer 180, and the antenna ground conductive layer 180 may be formed together with any one of the second conductive layers 1531 through the same plating process.

Figure 2B:
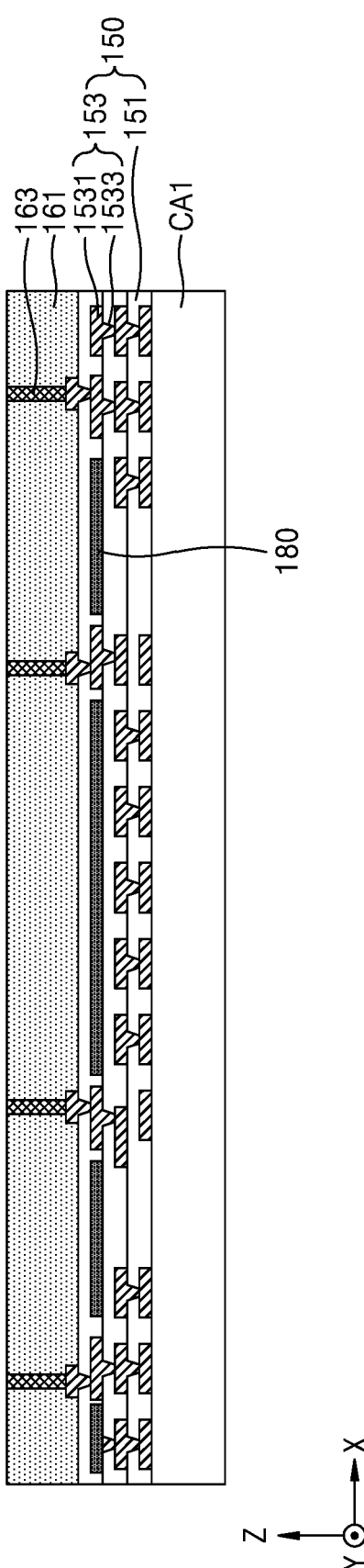

Referring to FIG. 2B, second vertical connection conductors 163 and a second molding layer 161 are formed on the second redistribution structure 150. For example, after the second vertical connection conductors 163 are formed on the second redistribution structure 150, a molding material covering the second vertical connection conductors 163 may be formed on the second redistribution structure 150, and a polishing process may be performed to remove a portion of the molding material from an upper side of the molding material until the second vertical connection conductors 163 are exposed. Another portion of the molding material remaining after the polishing process may constitute the second molding layer 161. The second molding layer 161 may cover the side surface of each of the second vertical connection conductors 163 and expose the upper surface of each of the second vertical connection conductors 163 to the outside. The polishing process may include a planarization process such as chemical mechanical polishing, and through the polishing process, a portion of the molding material and a portion of each of the second vertical connection conductors 163 may be removed. The upper surface of the second molding layer 161 and the upper surfaces of the second vertical connection conductors 163, obtained through the polishing process, may be planarized surfaces and may be coplanar.

Figure 2C:
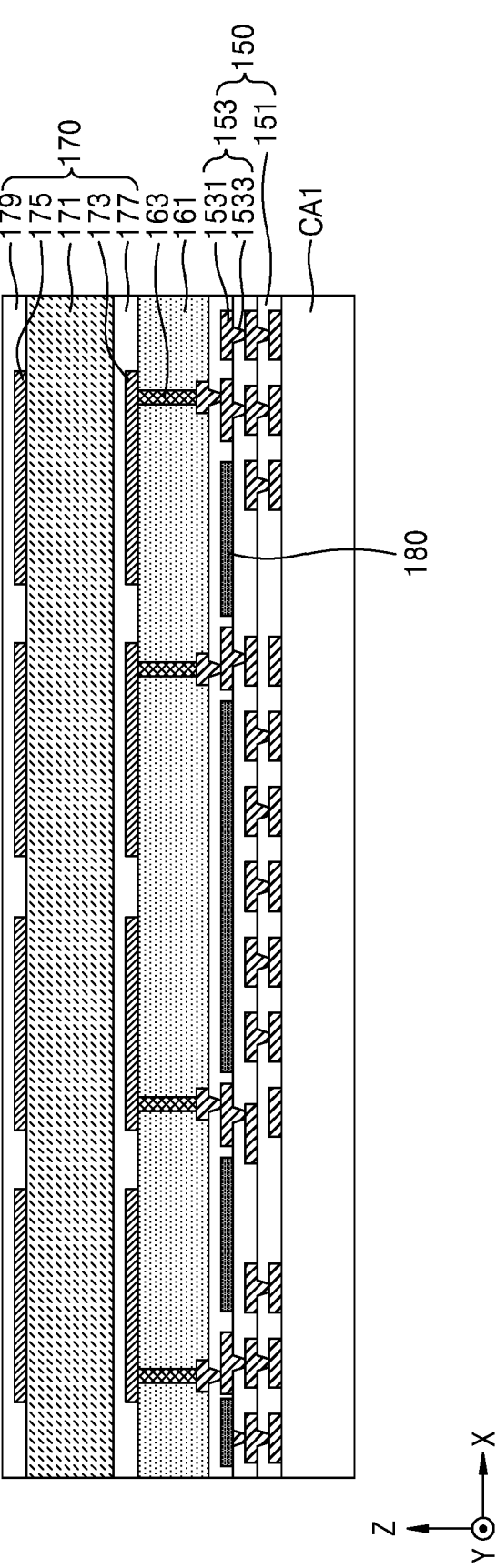

Referring to FIG. 2C, an antenna structure 170 is formed on the second molding layer 161. The forming of the antenna structure 170 may include forming active antenna patterns 173, which extends along the upper surface of the second molding layer 161, on the upper surface of the second molding layer 161, forming a lower cover insulating layer 177 covering the upper surface of the second molding layer 161 and the active antenna patterns 173, forming a dielectric layer 171 on the lower cover insulating layer 177, forming parasitic antenna patterns 175 on the dielectric layer 171, and forming an upper cover insulating layer 179 covering the parasitic antenna patterns 175 on the dielectric layer 171. The forming of the active antenna patterns 173 and the forming of the parasitic antenna patterns 175 may each include a plating process. The forming of the dielectric layer 171 may include disposing the dielectric layer 171 provided in the form of a film on the lower cover insulating layer 177. The second redistribution structure 150, the second molding layer 161, the second vertical connection conductors 163, and the antenna structure 170 may constitute a panel-shaped structure.

Figure 2D:
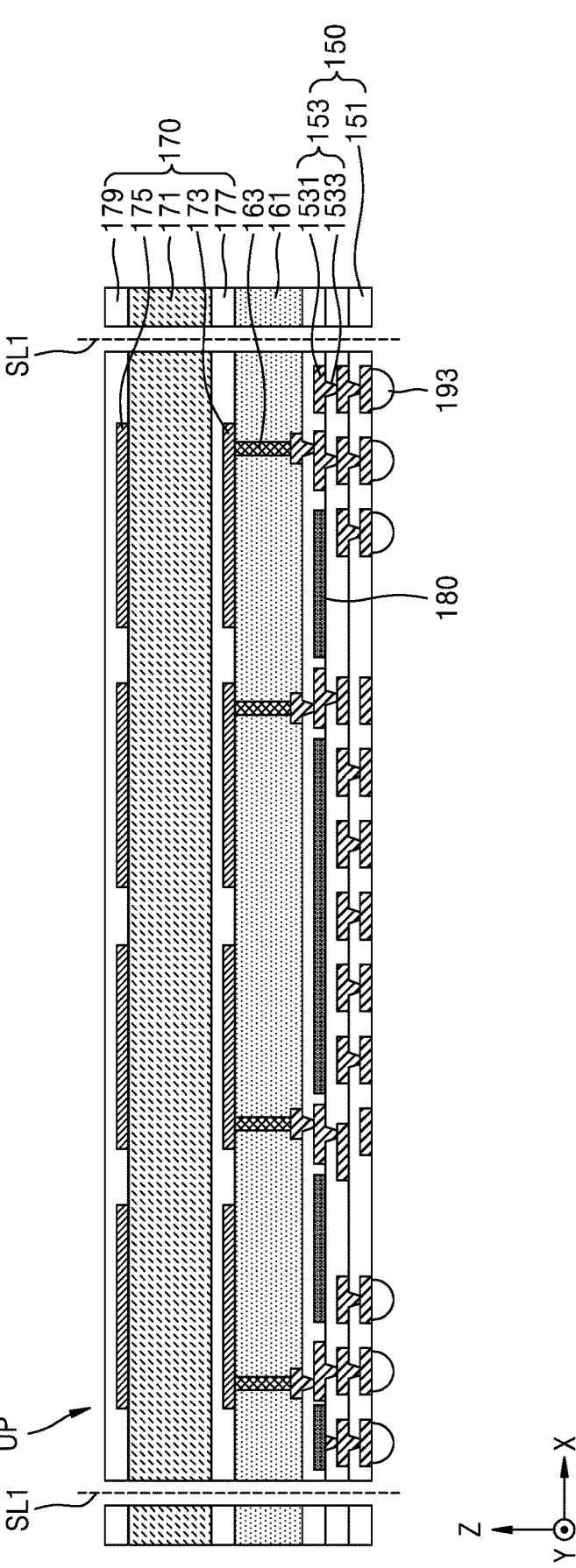

Referring to FIGS. 2C and 2D, the carrier substrate CA1 is separated from the second redistribution structure 150, and inter-package connection terminals 193 are attached to the lower surface of the second redistribution structure 150 exposed as the carrier substrate CA1 is separated from the second redistribution structure 150. Thereafter, a cutting process of cutting the panel-shaped structure along a cutting line SL1 may be performed to separate the panel-shaped structure into a plurality of upper packages UP. Optionally, an electrical test process may be performed on individual upper packages UP separated from the panel-type structure. A subsequent manufacturing process may be performed on upper packages UP determined to be good in the test process, and upper packages UP determined to be defective in the test process are discarded or repaired to remove defective elements.

FIGS. 3A to 3F are cross-sectional views illustrating a method of manufacturing the semiconductor package 10 shown in FIG. 1. Hereinafter, the method of manufacturing the semiconductor package 10 illustrated in FIG. 1 will be described with reference to FIGS. 3A to 3F.

Figure 3A:
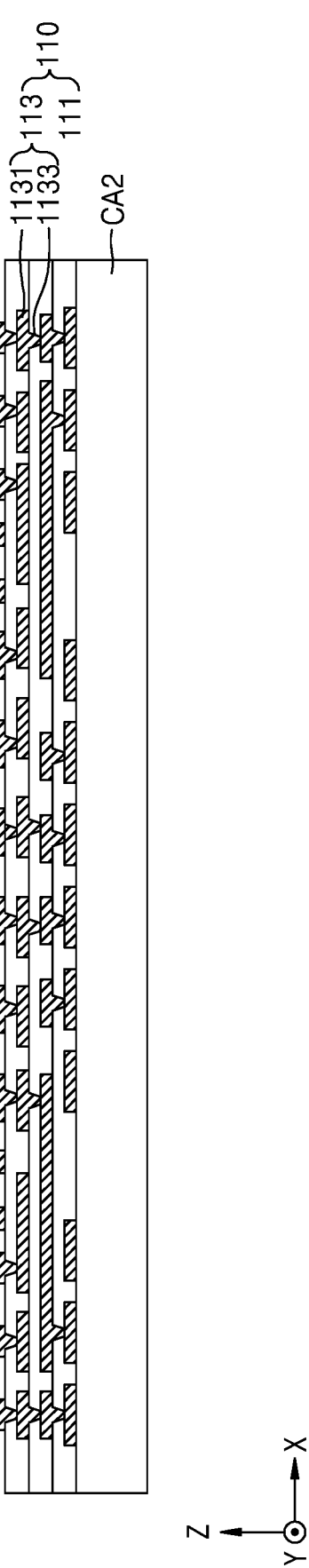
FIGS. 3A to 3F are cross-sectional views illustrating a method of manufacturing the semiconductor package shown in FIG. 1.

Referring to FIG. 3A, a carrier substrate CA2 is prepared. The carrier substrate CA2 may have a flat plate shape. In a plan view, the carrier substrate CA2 may have a circular shape or a polygonal shape such as a quadrangle. The carrier substrate CA2 may be, for example, a semiconductor substrate, a glass substrate, a ceramic substrate, or a plastic substrate.

Next, a first redistribution structure 110 including a plurality of first redistribution insulating layers 111 and a first conductive connection structure 113 is formed on the carrier substrate CA2. Each of the plurality of first redistribution insulating layers 111 may be formed through forming an insulating layer through a lamination process and forming via holes in the insulating layer through a patterning process of the insulating layer. First conductive layers 1131 and first conductive via patterns 1133, which constitute the first conductive connection structure 113, may be formed through a plating process.

Figure 3B:
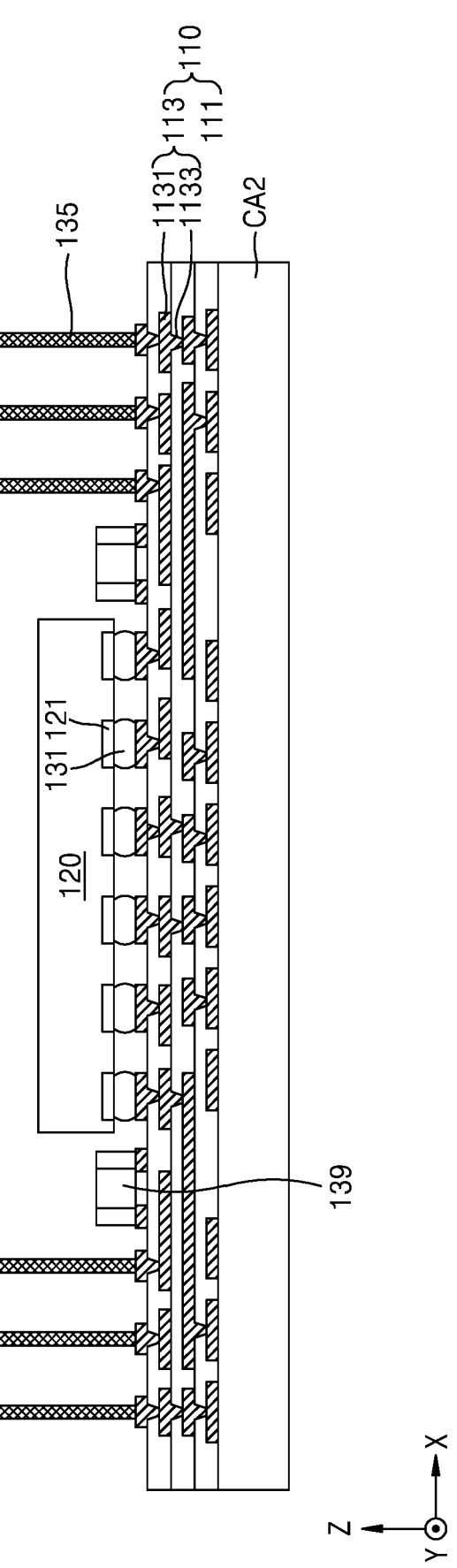

Referring to FIG. 3B, after the first redistribution structure 110 is formed, the semiconductor chip 120 and the passive component 139 are mounted on the first redistribution structure 110, and the first vertical connection conductors 135 are formed on the first redistribution structure 110. In some embodiments, after the mounting of the semiconductor chip 120 and the passive component 139 is completed, the forming of the first vertical connection conductors 135 may be performed. In some embodiments, after the formation of the first vertical connection conductors 135 is completed, the mounting of the semiconductor chip 120 and the passive component 139 may be performed.

Figure 3C:
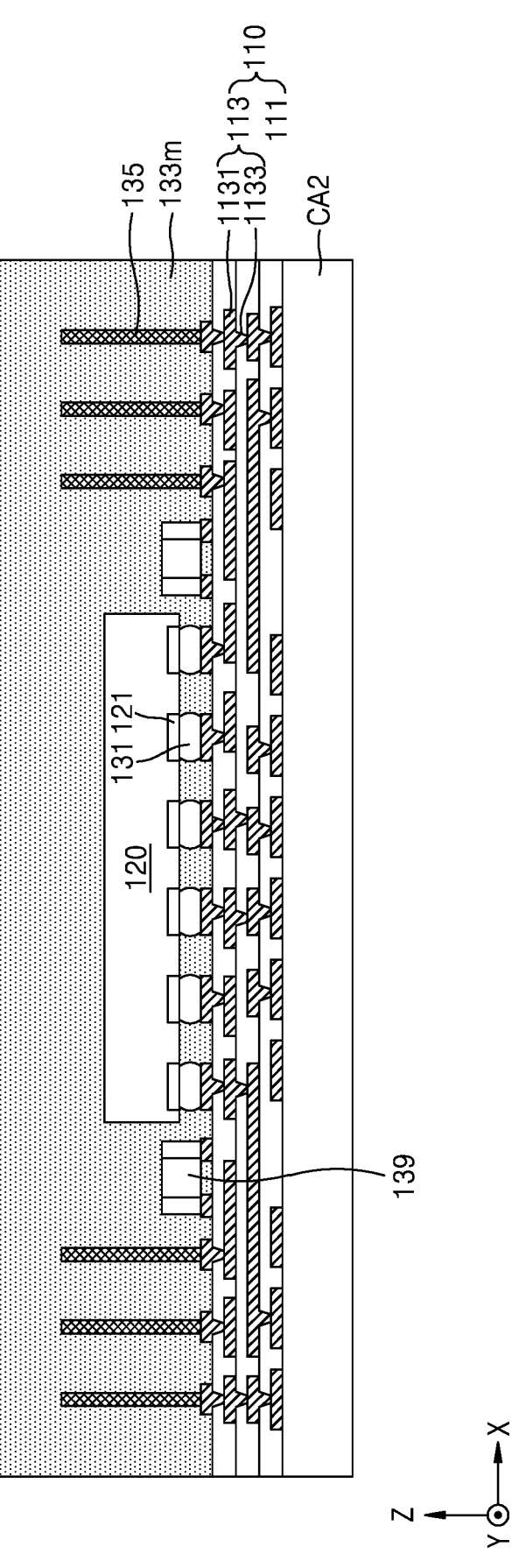

Referring to FIG. 3C, a molding material 133*m* covering the semiconductor chip 120, the passive component 139, and the first vertical connection conductors 135 is formed on the first redistribution structure 110.

Figure 3D:
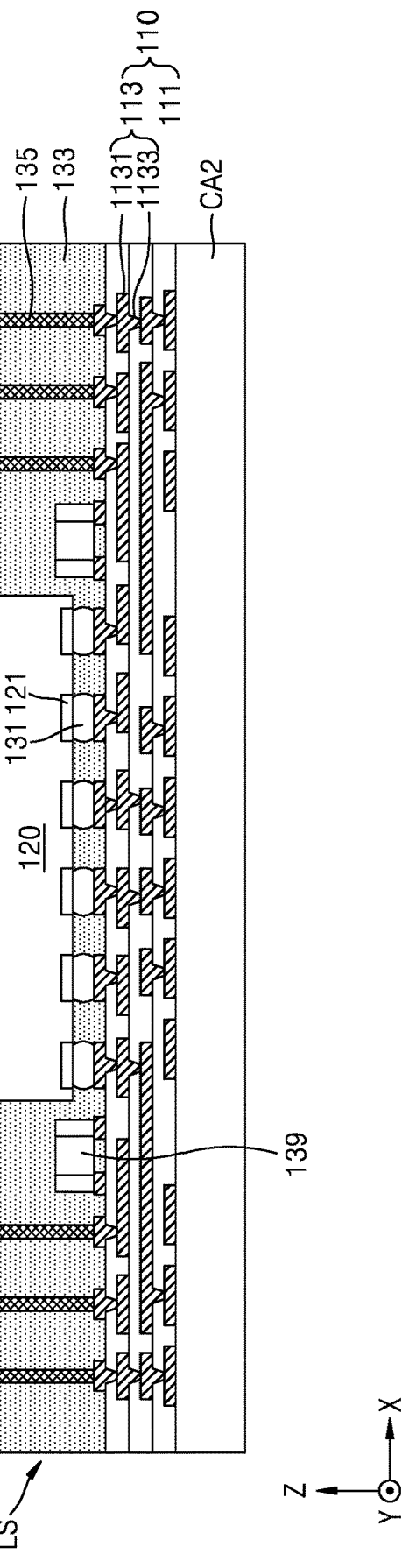

Referring to FIGS. 3C and 3D, a polishing process may be performed to remove a portion of the molding material 133*m* from an upper side of the molding material 133*m* until the first vertical connection conductors 135 are exposed. Another portion of the molding material 133*m* remaining after the polishing process may constitute the first molding layer 133. The first molding layer 133 may cover the side surface of the semiconductor chip 120 and the side surface of each of the first vertical connection conductors 135 and expose the upper surface of the semiconductor chip 120 and the upper surface of each of the first vertical connection conductors 135 to the outside. The polishing process may include a planarization process such as chemical mechanical polishing. Through the polishing process, a portion of the molding material 133*m*, a portion of the semiconductor chip 120, and a portion of each of the first vertical connection conductors 135 may be removed. The upper surface of the first molding layer 133, the upper surface of the semiconductor chip 120, and the upper surfaces of the first vertical connection conductors 135, obtained through the polishing process, may be planarized surfaces and may be coplanar.

The first redistribution structure 110, the first molding layer 133, the semiconductor chip 120, and the first vertical connection conductors 135 may constitute a panel-shaped lower structure LS.

Figure 3E:
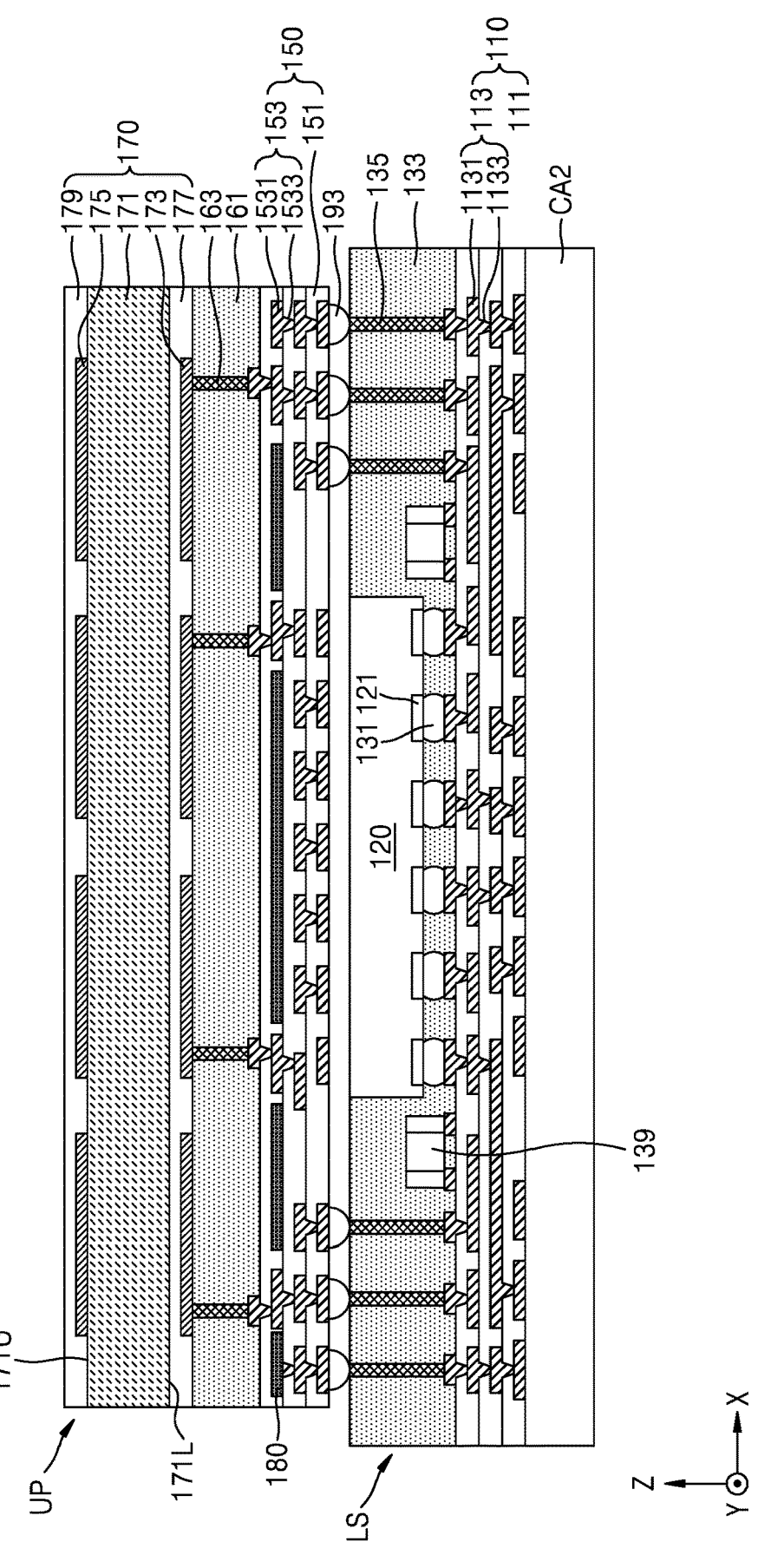

Referring to FIG. 3E, the upper package UP may be prepared, and the prepared upper package UP may be stacked on the panel-shaped lower structure LS. The upper package UP may be stacked on the lower package LP through inter-package connection terminals 193. In some embodiments, the preparing of the upper package UP may include manufacturing the upper package UP through the manufacturing method described with reference to FIGS. 2A to 2D.

In some embodiments, the panel-shaped lower structure LS may have a planar area in which a plurality of upper packages UP may be disposed side by side, and a plurality of upper packages UP may be disposed side by side on the panel-shaped lower structure LS. That is, the plurality of upper packages UP may be mounted on the panel-shaped lower structure LS to be spaced apart from each other along the upper surface of the panel-shaped lower structure LS.

Figure 3F:
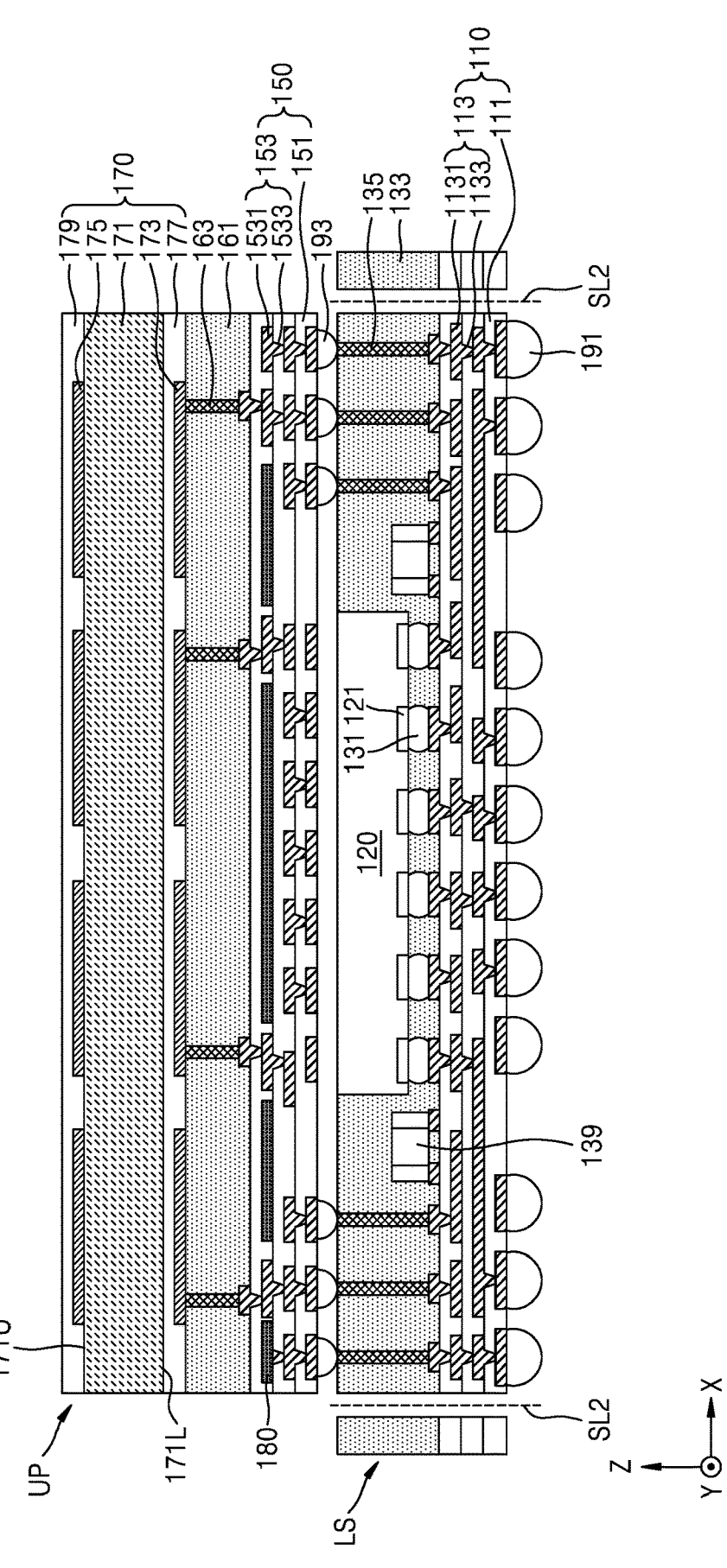

Referring to FIG. 3F, the carrier substrate CA2 is separated from the first redistribution structure 110, and external connection terminals 193 are attached to the lower surface of the first redistribution structure 110 exposed as the carrier substrate CA2 is separated from the first redistribution structure 110. Thereafter, a cutting process of cutting the panel-shaped lower structure LS along a cutting line SL2 may be performed to separate the panel-shaped lower structure LS into a plurality of lower packages LP. One upper package UP may be stacked on one lower package LP, and one lower package LP and one upper package UP may constitute the semiconductor package 10.

Figure 4:
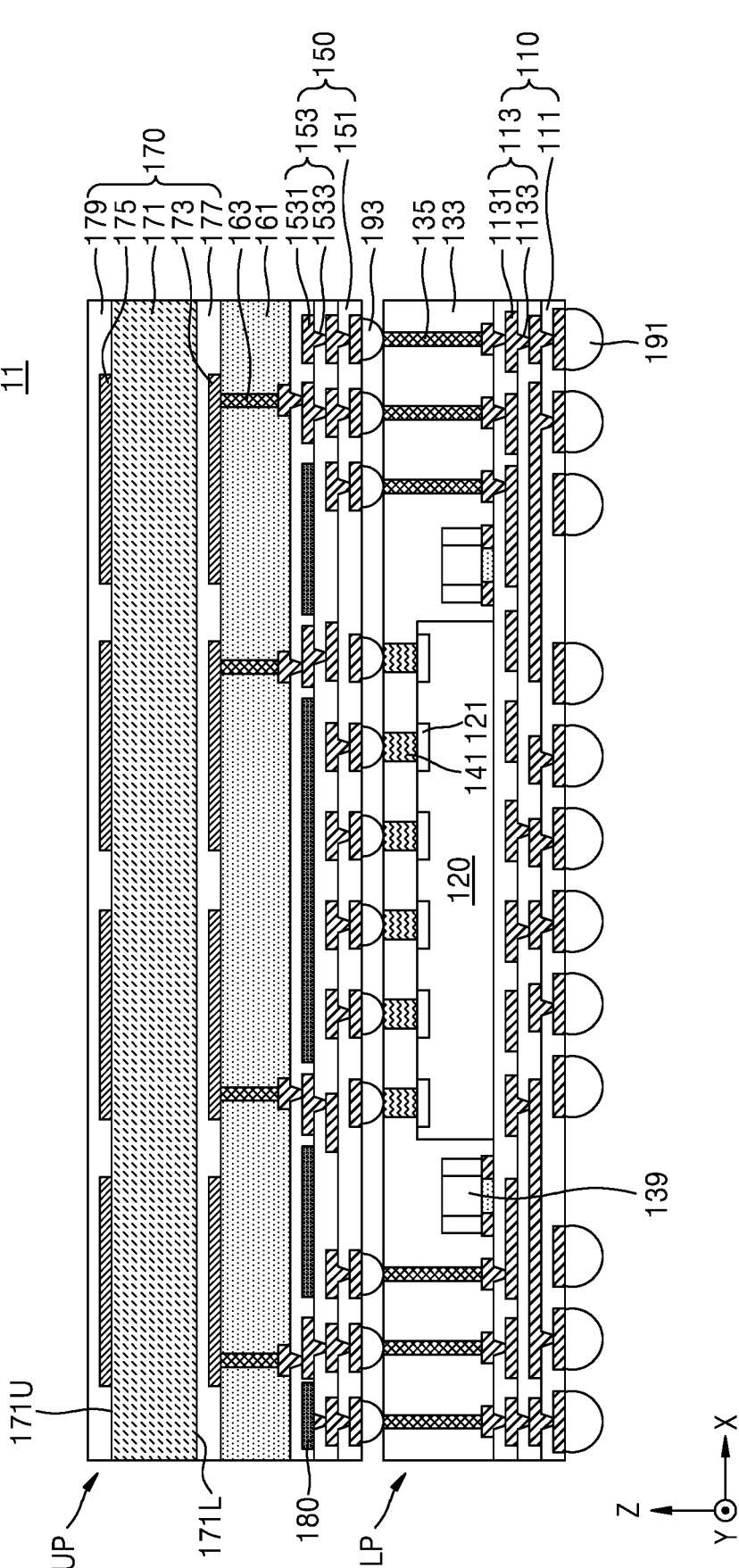
FIG. 4 is a cross-sectional view illustrating a semiconductor package according to some embodiments.

FIG. 4 is a cross-sectional view illustrating a semiconductor package 11 according to some embodiments. Hereinafter, the semiconductor package 11 shown in FIG. 4 will be described, focusing on differences from the semiconductor package 10 described with reference to FIG. 1.

Referring to FIG. 4, in the lower package LP of the semiconductor package 11, the semiconductor chip 120 may be disposed on the first redistribution structure 110 in a face-up manner. In the semiconductor chip 120, chip pads 121 may be provided on the upper surface of the semiconductor chip 120, and the lower surface of the semiconductor chip 120 may contact the upper surface of the first redistribution structure 110.

The lower package LP may include conductive connection pillars 141 disposed on the chip pads 121 of the semiconductor chip 120. The conductive connection pillars 141 may pass through the first molding layer 133. Each of the conductive connection pillars 141 may vertically extend from the upper surface of the first molding layer 133 to a corresponding chip pad 121 of the first semiconductor chip 120. The first molding layer 133 may be formed not to cover the upper surfaces of the conductive connection pillars 141, and the upper surface of the first molding layer 133 may be coplanar with the upper surfaces of the conductive connection pillars 141.

Some of the inter-package connection terminals 193 may be disposed between the upper surfaces of the conductive connection pillars 141 and the lower surface of the second redistribution structure 150, and may physically and electrically connect the conductive connection pillars 141 to pads included in the lowermost second conductive layer 1531. In this case, the semiconductor chip 120 may be electrically connected to active antenna patterns 173 through the conductive connection pillars 141, the inter-package connection terminals 193, the second conductive connection structure 153, and the second vertical connection conductors 163.

Figure 5:
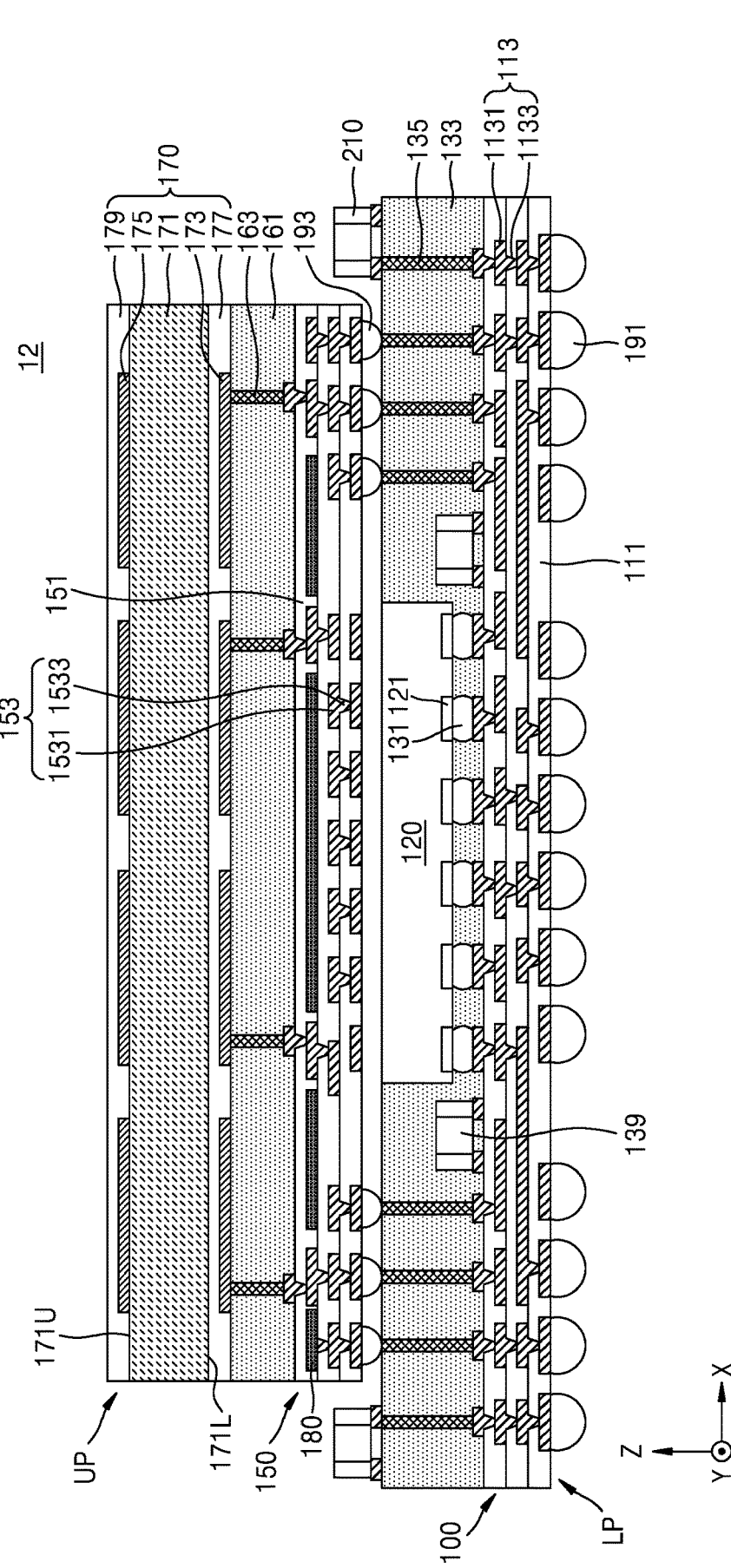
FIG. 5 is a cross-sectional view illustrating a semiconductor package according to some embodiments.

FIG. 5 is a cross-sectional view illustrating a semiconductor package 12 according to some embodiments. Hereinafter, the semiconductor package 12 shown in FIG. 5 will be described, focusing on differences from the semiconductor package 10 described with reference to FIG. 1.

Referring to FIG. 5, in the semiconductor package 12, the footprint of the lower package LP may be larger than that of the upper package UP. When viewed in a cross-section, the horizontal width of the lower package LP may be greater than the horizontal width of the upper package UP, and a portion of the lower package LP may protrude from a sidewall of the upper package UP in a lateral direction.

In some embodiments, a passive component 210 may be mounted on the lower package LP. The passive component 210 may include a capacitor, an inductor, a resistor, an IPD, and the like. The passive component 210 may be disposed on an edge area of the upper surface of the lower package LP. The passive component 210 may be mounted on the lower package LP to be spaced apart from the upper package UP in a horizontal direction (e.g., an X direction and/or a Y direction), and may overlap the second redistribution structure 150 of the upper package UP in the horizontal direction (e.g., the X direction and/or the Y direction).

Figure 6:
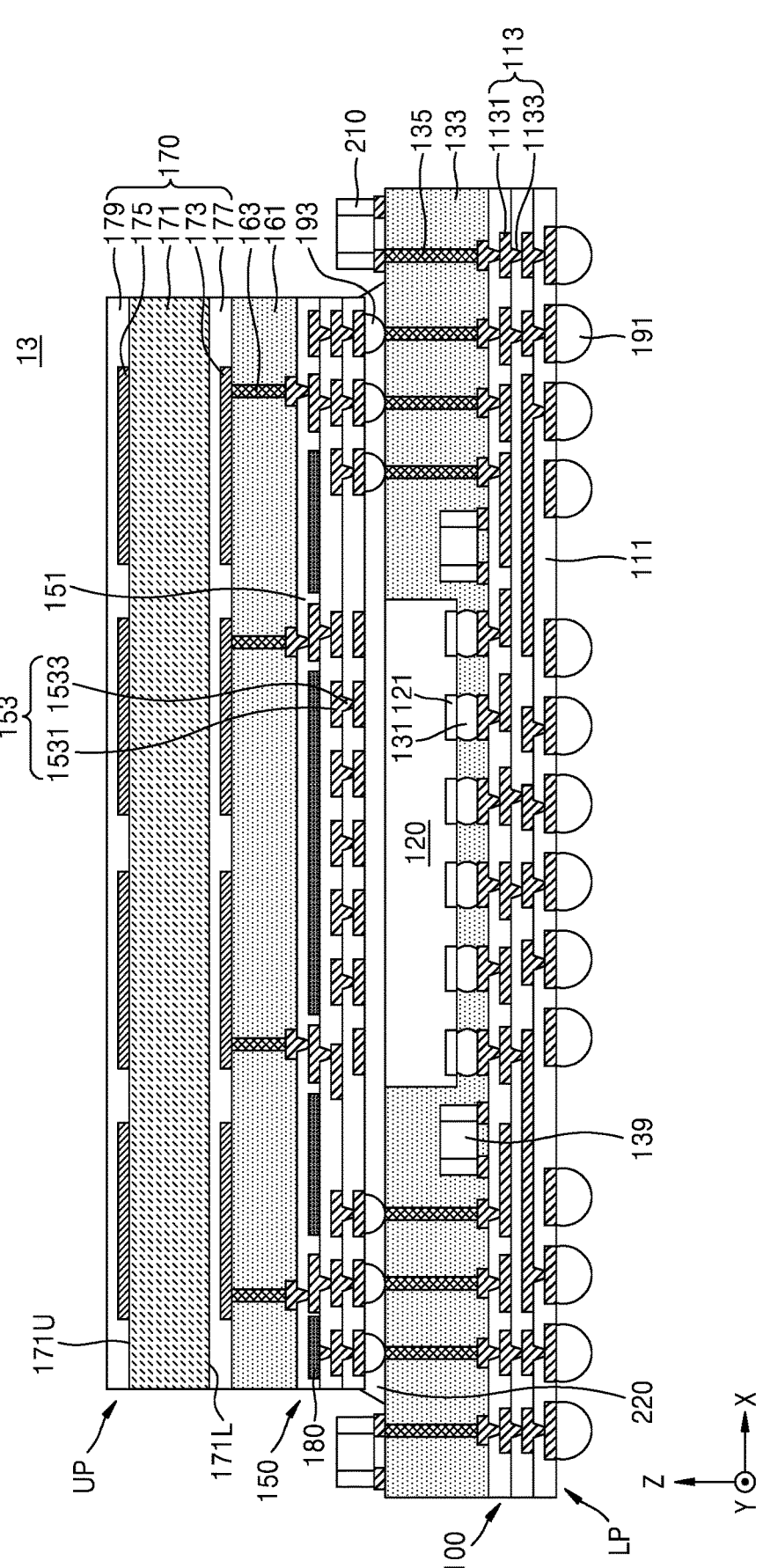
FIG. 6 is a cross-sectional view illustrating a semiconductor package according to some embodiments.

FIG. 6 is a cross-sectional view illustrating a semiconductor package 13 according to some embodiments. Hereinafter, the semiconductor package 13 shown in FIG. 6 will be described, focusing on differences from the semiconductor package 12 described with reference to FIG. 5.

Referring to FIG. 6, the semiconductor package 13 may further include an underfill layer 220 disposed between the upper package UP and the lower package LP. The underfill layer 220 may fill a gap between the upper package UP and the lower package LP, and may surround the side surface of each of the inter-package connection terminals 193 provided between the upper package UP and the lower package LP. The underfill layer 220 may include an insulating material, for example, an epoxy resin. The underfill layer 220 may be formed through, for example, a capillary underfill process.

Figure 7:
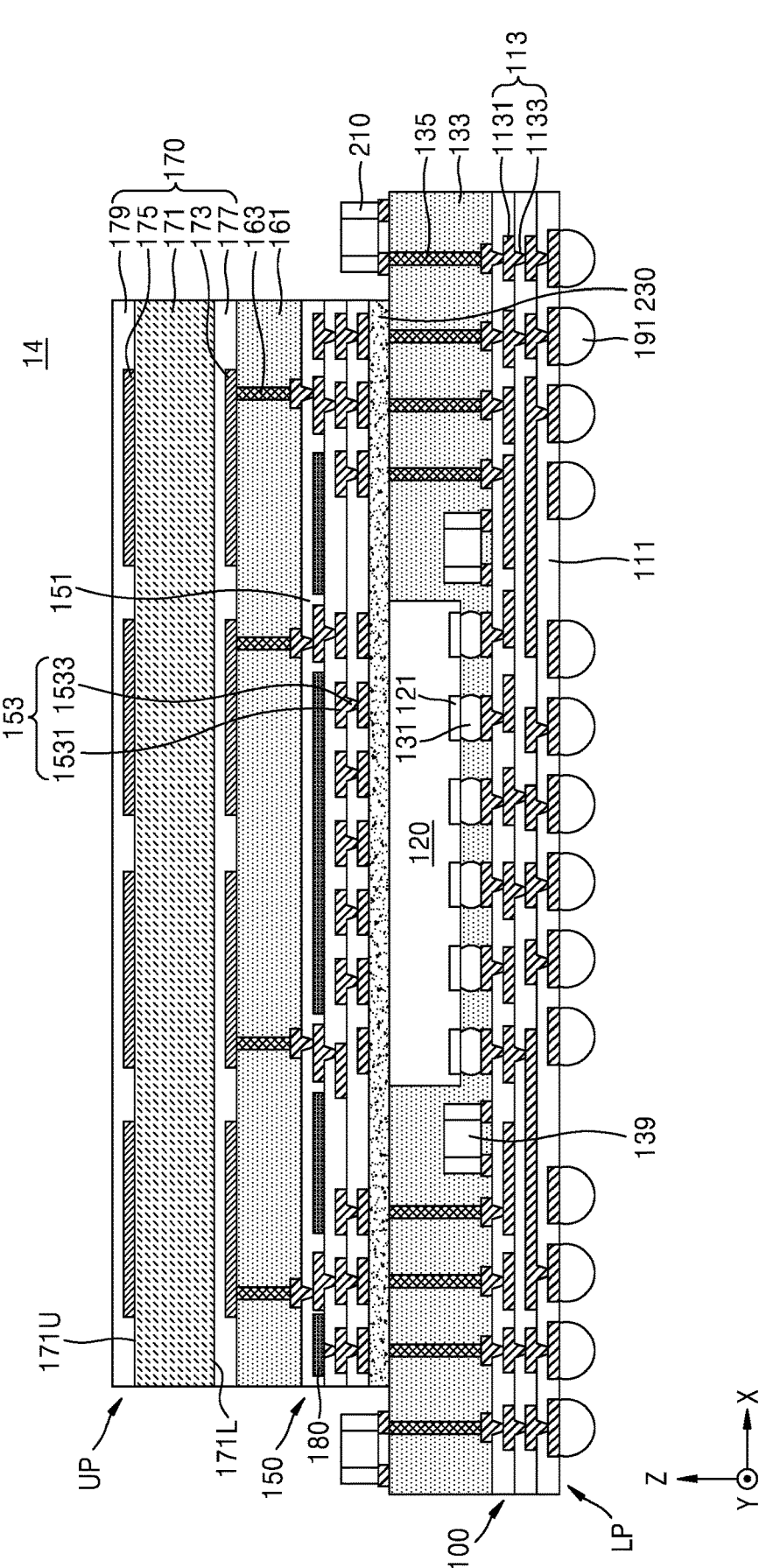
FIG. 7 is a cross-sectional view illustrating a semiconductor package according to some embodiments.

FIG. 7 is a cross-sectional view illustrating a semiconductor package 14 according to some embodiments. Hereinafter, the semiconductor package 14 shown in FIG. 7 will be described, focusing on differences from the semiconductor package 12 described with reference to FIG. 5.

Referring to FIG. 7, the semiconductor package 14 may include an anisotropic conductive layer 230 disposed between the upper package UP and the lower package LP. The anisotropic conductive layer 230 may fill a gap between the upper package UP and the lower package LP. The anisotropic conductive layer 230 may include, for example, an anisotropic conductive film or an anisotropic conductive paste. The anisotropic conductive layer 230 may have a structure in which conductive particles are dispersed in an insulating adhesive layer. The anisotropic conductive layer 230 may have anisotropic electrical characteristics to allow conduction only in a vertical direction (e.g., a Z direction) and be insulated in the horizontal direction (e.g., the X direction and/or the Y direction). The upper package UP may be fixed on the lower package LP by the anisotropic conductive layer 230. The anisotropic conductive layer 230 may contact first vertical connection conductors 135 of the lower package LP and contact pads included in the lowermost second conductive layer 1531. The first vertical connection conductors 135 may be electrically connected to a second conductive connection structure 153 through the anisotropic conductive layer 230.

Figure 8:
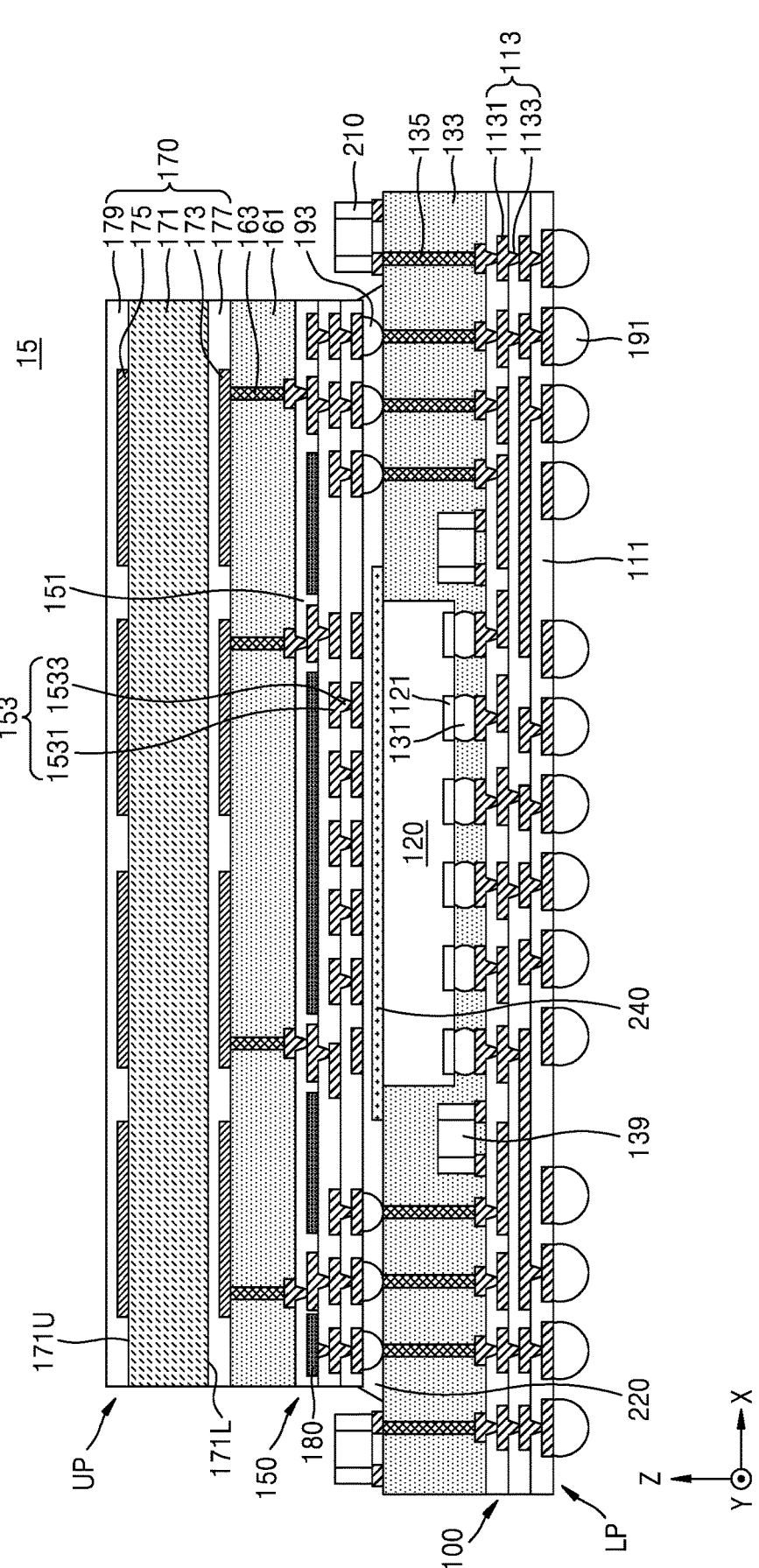
FIG. 8 is a cross-sectional view illustrating a semiconductor package according to some embodiments.

FIG. 8 is a cross-sectional view illustrating a semiconductor package 15 according to some embodiments. Hereinafter, the semiconductor package 15 shown in FIG. 8 will be described, focusing on differences from the semiconductor package 12 described with reference to FIG. 5.

Referring to FIG. 8, the semiconductor package 15 may include a ground conductive layer 240 disposed between the upper surface of a semiconductor chip 120 and an upper package UP. The ground conductive layer 240 may extend along the upper surface of the semiconductor chip 120 and cover the upper surface of the semiconductor chip 120. Furthermore, the ground conductive layer 240 may extend along a portion of the upper surface of a first molding layer 133 around the upper surface of the semiconductor chip 120 and cover a portion of the upper surface of the first molding layer 133.

The ground conductive layer 240 may be electrically grounded. For example, the ground conductive layer 240 may be connected to at least one of the first vertical connection conductors 135, and may be configured to receive a ground signal through an external connection terminal 191 to which a ground signal (or ground voltage) provided from the outside is applied, a first conductive connection structure 113, and a first vertical connection conductor 135.

The ground conductive layer 240 may be formed to cover the upper surface of the semiconductor chip 120 to shield EMI to the semiconductor chip 120. In some embodiments, the ground conductive layer 240 may function as an antenna ground for an active antenna pattern 173 of an antenna structure 170. In some embodiments, the antenna ground conductive layer 180 may be omitted, and the ground conductive layer 240 may function as an antenna ground for the active antenna pattern 173 in place of the antenna ground conductive layer 180. In some embodiments, the ground conductive layer 240 may function as an antenna ground for the active antenna pattern 173 together with the antenna ground conductive layer 180.

Figure 9:
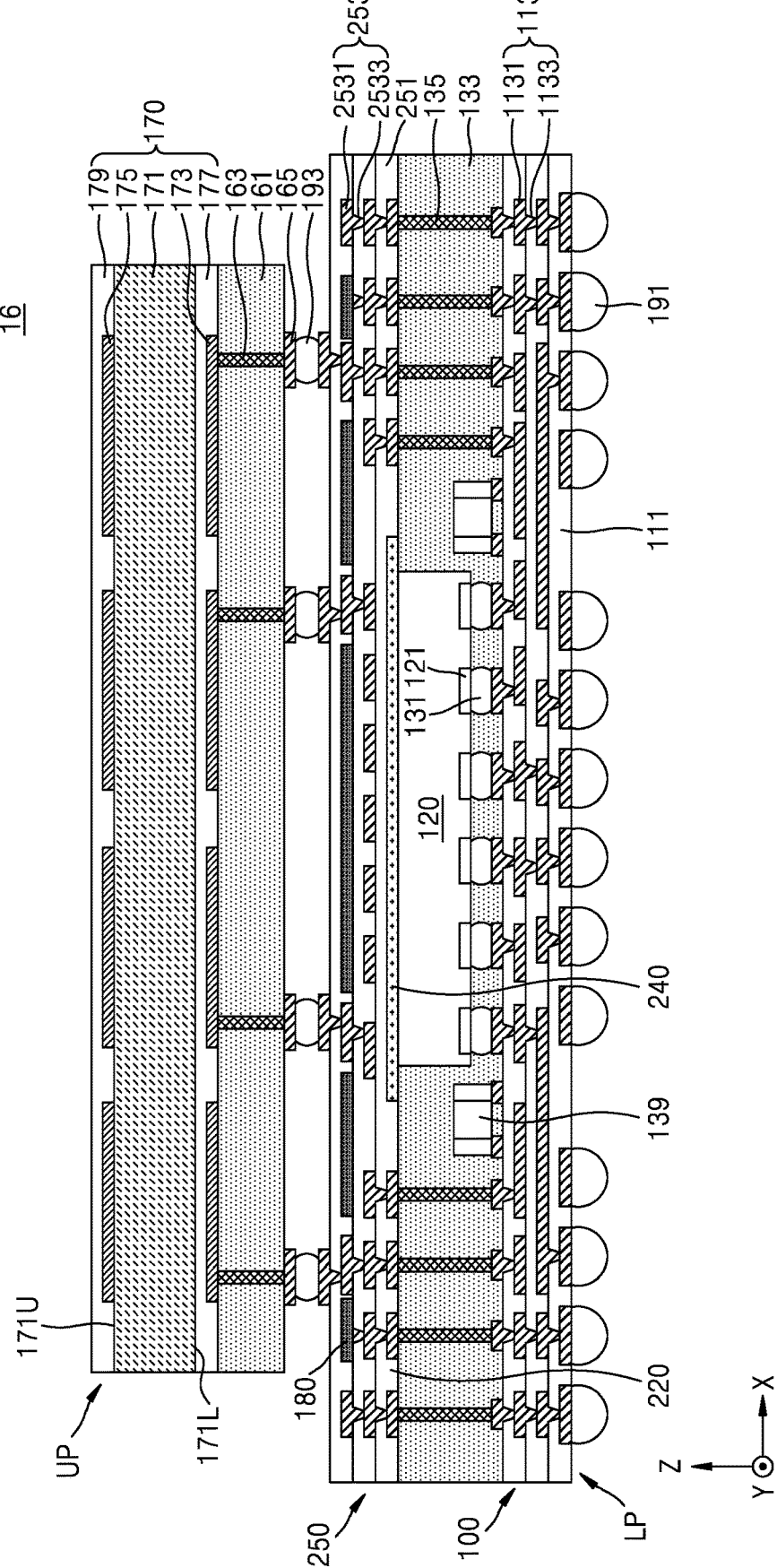
FIG. 9 is a cross-sectional view illustrating a semiconductor package according to some embodiments.

FIG. 9 is a cross-sectional view illustrating a semiconductor package 16 according to some embodiments. Hereinafter, the semiconductor package 16 shown in FIG. 9 will be described, focusing on differences from the semiconductor package 15 described with reference to FIG. 8.

Figure 14:
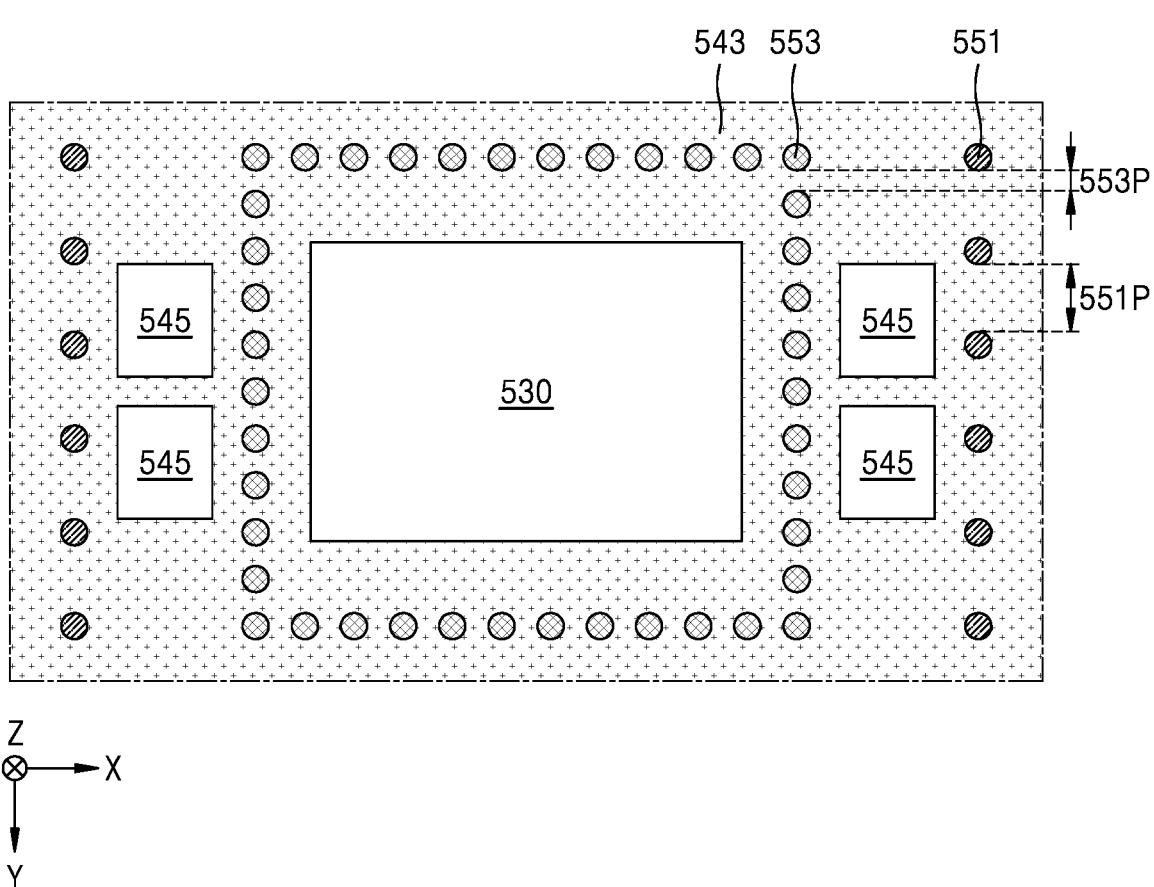
FIG. 14 is a layout diagram showing a configuration of a semiconductor package according to some embodiments.

Referring to FIG. 9, in the semiconductor package 16, the lower package LP may further include a third redistribution structure 250 disposed on the first molding layer 133 and the semiconductor chip 120, and the second redistribution structure 150 in FIG. 14 may be omitted in the upper package UP. The second molding layer 161 of the upper package UP may directly face the lower package LP. The inter-package connection terminals 193 may be connected to conductive pads 165 extending along the lower surface of the second molding layer 161, and may be electrically connected to the second vertical connection conductors 163 through the conductive pads 165.

The third redistribution structure 250 may include a plurality of third redistribution insulating layers 251 and a third conductive connection structure 253.

The plurality of third redistribution insulating layers 251 may be mutually stacked in a vertical direction (e.g., a Z direction). The plurality of third redistribution insulating layers 251 may include insulating polymer, epoxy, or a combination thereof.

The third conductive connection structure 253 may include third conductive layers 2531 each disposed on one of upper and lower surfaces of each of the plurality of third redistribution insulating layers 251, and third conductive via patterns 2533 extending in the vertical direction (e.g., the Z direction) through at least one of the plurality of third redistribution insulating layers 251. The third conductive layers 2531 may be disposed at different vertical levels to form a multilayer structure. Each of the third conductive layers 2531 may include a line pattern extending in a line shape along one of the upper and lower surfaces of each of the plurality of third redistribution insulating layers 251. The uppermost third conductive layer 2531 provided on the uppermost insulating layer among the plurality of third redistribution insulating layers 251 may include upper pads to which the inter-package connection terminals 193 are attached. The lowermost third conductive layer 2531 provided on the lowermost insulating layer among the plurality of third redistribution insulating layers 251 may include lower pads connected to the first vertical connection conductors 135. The third conductive via patterns 2533 may electrically connect the third conductive layers 2531 disposed at different vertical levels.

An antenna ground conductive layer 180 may be provided in the third redistribution structure 250. The antenna ground conductive layer 180 may have a plane or flat plate shape extending along the surface of any one of the plurality of third redistribution insulating layers 251. The antenna ground conductive layer 180 may be at the same vertical level as any one of the third conductive layers 2531, and may be formed together with any one of the third conductive layers 2531 through the same plating process. The antenna ground conductive layer 180 may be electrically grounded and function as an antenna ground for the active antenna pattern 173. The antenna ground conductive layer 180 may be substantially the same as the antenna ground conductive layer 180 described above, and duplicate descriptions thereof are omitted here.

Figure 10:
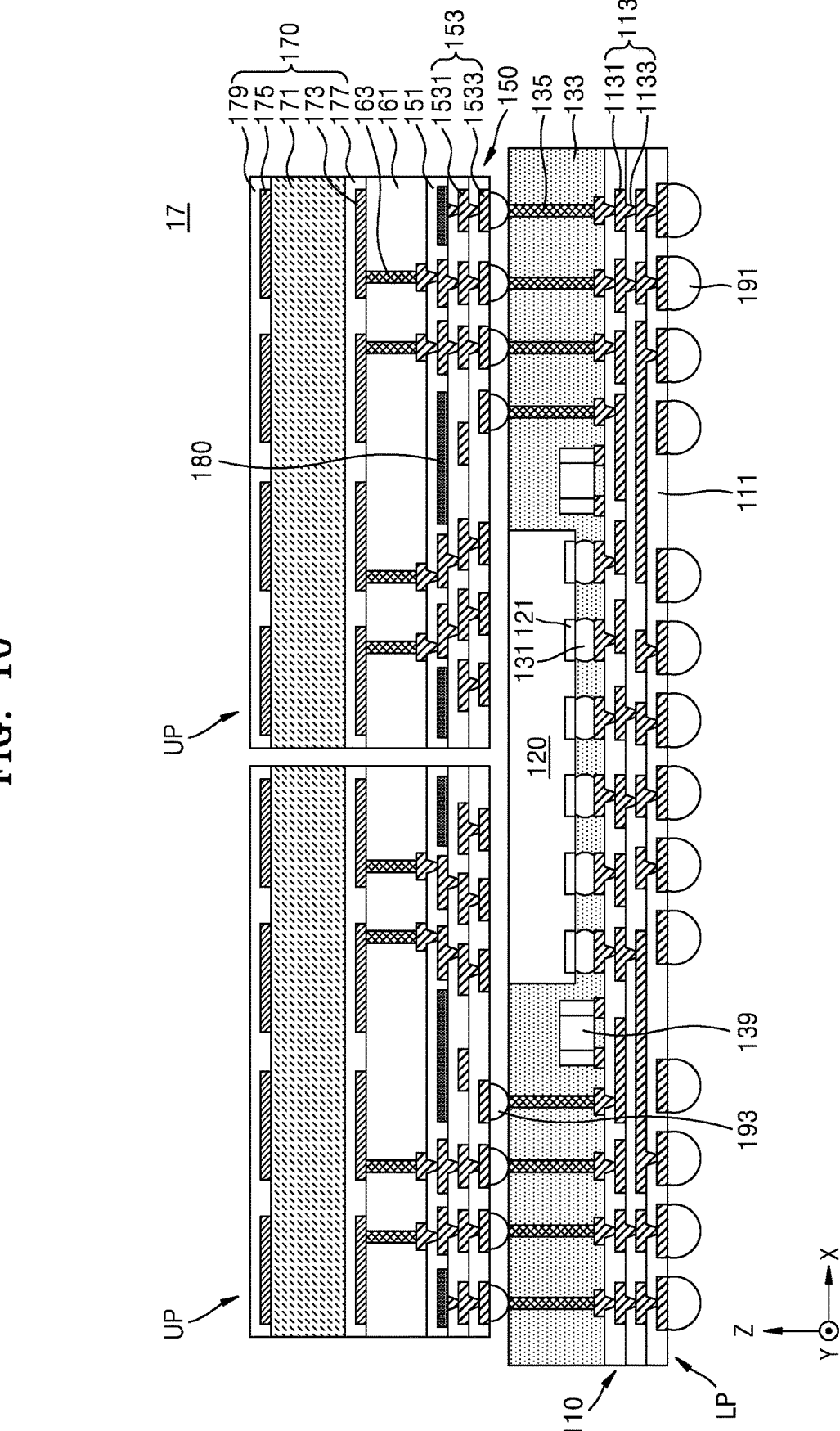
FIG. 10 is a cross-sectional view illustrating a semiconductor package according to some embodiments.

FIG. 10 is a cross-sectional view illustrating a semiconductor package 17 according to some embodiments. Hereinafter, the semiconductor package 17 shown in FIG. 10 will be described, focusing on differences from the semiconductor package 12 described with reference to FIG. 5.

Referring to FIG. 10, a plurality of upper packages UP may be disposed on a lower package LP. The plurality of upper packages UP may be spaced apart from each other in a lateral direction along the upper surface of the lower package LP, and may be electrically and physically connected to the lower package LP through inter-package connection terminals 193. Each of the plurality of upper packages UP may be substantially the same as or similar to any one of the upper packages UP described above with reference to FIGS. 1 to 9. Although it is illustrated in FIG. 10 that two upper packages UP (e.g., a first upper package and a second upper package) are disposed on the lower package LP, upper packages UP spaced apart from each other in a lateral direction may be disposed on the lower package LP. For example, in order to manufacture the semiconductor package 17, after preparing a panel-shaped lower structure LS shown in FIG. 3D, stacking a plurality of upper packages UP (e.g., a first upper package and a second upper package) on the panel-shaped lower structure LS by using inter-package connection terminals 193, and cutting the panel-shaped lower structure LS so that the plurality of upper packages UP (e.g., the first upper package and the second upper package) are included in individual unit packages may be sequentially performed.

In some embodiments, antenna structures 170 included in the plurality of upper packages UP may be configured to emit or receive radio signals in different wavelength bands. Here, the different wavelength bands may include a case of including a partially common wavelength band and a case of not having a common wavelength band. For example, a first antenna structure included in the first upper package may be configured to radiate or receive a radio signal in a first wavelength band, and a second antenna structure included in the second upper package may be configured to radiate or receive a radio signal in a second wavelength band that is different from the first wavelength band.

Figure 11:
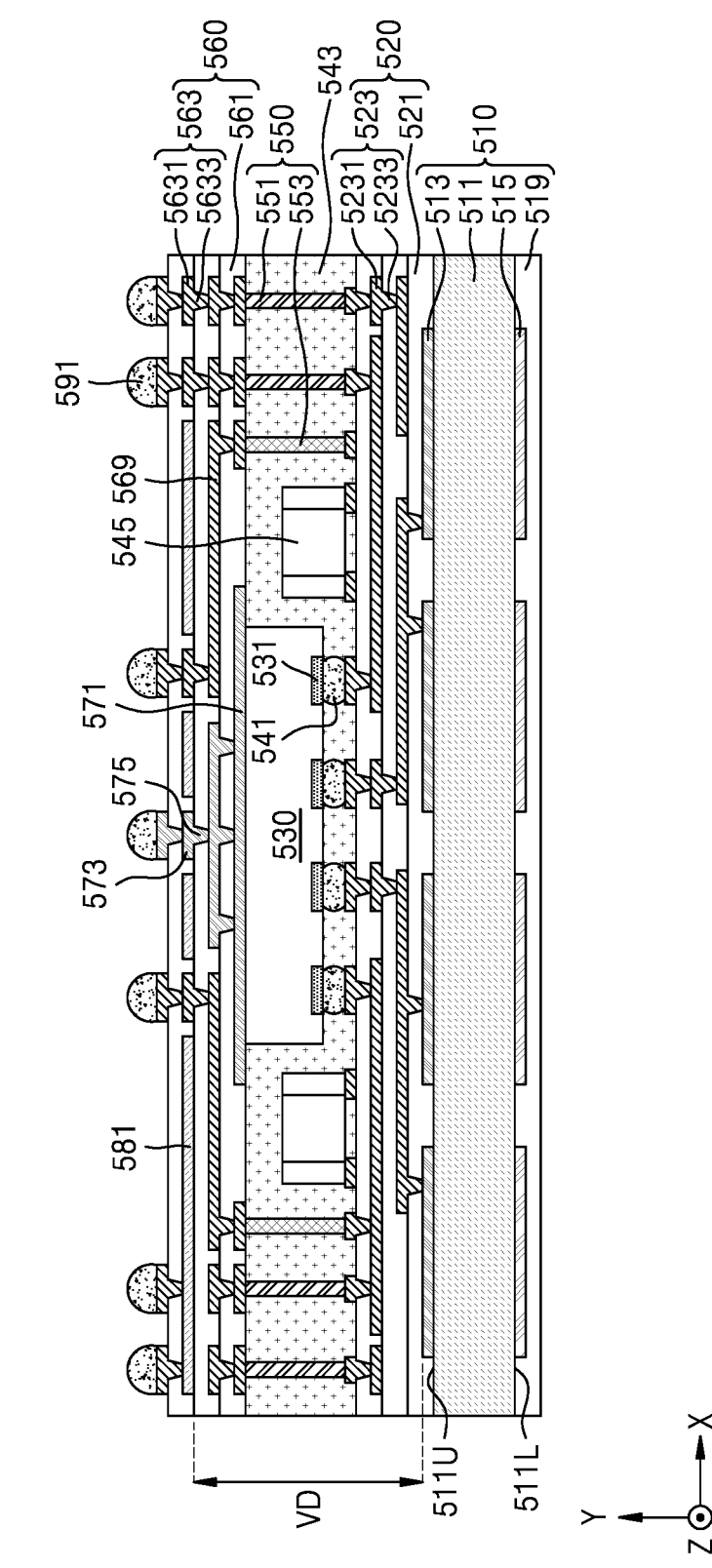
FIG. 11 is a cross-sectional view illustrating a semiconductor package according to some embodiments.

FIG. 11 is a cross-sectional view illustrating a semiconductor package 50 according to some embodiments.

Referring to FIG. 11, the semiconductor package 50 may include an antenna structure 510, a first redistribution structure 520, a semiconductor chip 530, a molding layer 543, a vertical connection conductor 550, a second redistribution structure 560, and a heat dissipation pad 571.

The antenna structure 510 may include a dielectric layer 511, an active antenna pattern 513, and a parasitic antenna pattern 515.

The dielectric layer 511 may include a first surface 511U and a second surface 511L, which are opposite to each other. The dielectric layer 511 may have a substantially flat plate shape, and the first surface 511U and the second surface 511L may be planar. The first surface 511U and the second surface 511L of the dielectric layer 511 may be parallel to each other.

In the present embodiment, the horizontal direction is defined as a direction (e.g., an X direction and/or a Y direction) parallel to the first surface 511U of the dielectric layer 511, and the vertical direction is defined as a direction (e.g., a Z direction) parallel to the first surface 511U of the dielectric layer 511. In addition, the horizontal width or horizontal distance is defined as a length in the horizontal direction (e.g., the X direction and/or the Y direction), and the thickness, vertical width or vertical distance is defined as a length in the vertical direction (e.g., the Z direction).

The material of the dielectric layer 511 may be substantially the same as or similar to that of the dielectric layer 171 described with reference to FIG. 1. The dielectric layer 511 may have low dielectric constant and low dissipation factor characteristics. For example, the dielectric constant of the dielectric layer 511 may be 4 or less, 3.5 or less, 3 or less, or 2.5 or less. For example, the dissipation factor of the dielectric layer 511 may be 0.009 or less, 0.007 or less, 0.005 or less, or 0.003 or less.

In some embodiments, the thickness of dielectric layer 511 may be between 50 micrometers and 350 micrometers, between 100 micrometers and 300, or between 150 micrometers and 250 micrometers. In some embodiments, the thickness of the dielectric layer 511 may be 200 micrometers.

The active antenna pattern 513 may be disposed on the first surface 511U of the dielectric layer 511 facing the semiconductor chip 530. In some embodiments, the active antenna pattern 513 may have a structure and shape suitable for performing communication in a predetermined wavelength band. In some embodiments, the active antenna pattern 513 may be configured to radiate or receive a radio signal in the millimeter wavelength band. The active antenna pattern 513 may function as a radiator of an antenna and/or a director of an antenna. For example, the active antenna pattern 513 may include a patch antenna or a dipole antenna.

In some embodiments, the interval between two neighboring active antenna patterns 513 may be between 10% and 400%, between 30% and 300%, or between 50% and 150% of the horizontal width of the active antenna pattern 513. In some embodiments, the interval between two neighboring active antenna patterns 513 may be equal to the horizontal width of the active antenna pattern 513.

In some embodiments, the active antenna pattern 513 may include at least one first active antenna pattern configured to radiate or receive a radio signal in a first wavelength band, and at least one second active antenna pattern configured to radiate or receive a radio signal in a second wavelength band different from the first wavelength band. The at least one first active antenna pattern and the at least one second active antenna pattern may be electrically connected to the semiconductor chip 530 through different electrical connection paths. The at least one first active antenna pattern and the at least one second active antenna pattern may have different shapes and/or different dimensions (e.g., different horizontal widths).

The parasitic antenna pattern 515 may be disposed on the second surface 511L of the dielectric layer 511. For example, the parasitic antenna pattern 515 may extend the bandwidth of wireless communication using the active antenna pattern 513. The parasitic antenna pattern 515 may be spaced apart from the active antenna pattern 513 in the vertical direction (e.g., the Z direction) with the dielectric layer 511 therebetween. The parasitic antenna pattern 515 may be a patch antenna having a polygonal shape such as a circle or a quadrangle in a plan view, or may have a line shape formed on the second surface 511L of the dielectric layer 511. The antenna structure 510 may further include a protective insulating layer 519 covering the second surface 511L of the dielectric layer 511 and the parasitic antenna pattern 515.

In some embodiments, the parasitic antenna pattern 515 may have the same shape as the active antenna pattern 513 in a plan view, and the parasitic antenna pattern 515 and the active antenna pattern 513 may overlap each other in a plan view. In other embodiments, the shape of the parasitic antenna pattern 515 may be different from the shape of the active antenna pattern 513.

In some embodiments, the parasitic antenna pattern 515 may be exposed to the outside. For example, the protective insulating layer 519 may be omitted so that the parasitic antenna pattern 515 is exposed to the outside.

In some embodiments, the protective insulating layer 519 may be omitted, and the parasitic antenna pattern 515 may be at least partially buried in the dielectric layer 511. The parasitic antenna pattern 515 is partially buried in the dielectric layer 511, but a portion of the parasitic antenna pattern 515 may be exposed to the outside. For example, the lower surface of the parasitic antenna pattern 515 may be exposed to the outside.

The active antenna pattern 513 and the parasitic antenna pattern 515 may include a conductive material. For example, the active antenna pattern 513 and the parasitic antenna pattern 515 may include a metal such as Cu or Al.

The first redistribution structure 520 may be provided on the first surface 511U of the dielectric layer 511 and may function as a mounting substrate on which the semiconductor chip 530 is mounted. The first redistribution structure 520 may include a plurality of first redistribution insulating layers 521 and a first conductive connection structure 523.

The plurality of first redistribution insulating layers 521 may be stacked on the first surface 511U of the dielectric layer 511 in the vertical direction (e.g., the Z direction). The plurality of first redistribution insulating layers 521 may include insulating polymer, epoxy, or a combination thereof. In some embodiments, each of the plurality of first redistribution insulating layers 521 may include a material different from a material constituting the dielectric layer 511. In some embodiments, the dielectric constant of each of the plurality of first redistribution insulating layers 521 may be different from that of the dielectric layer 511.

The first conductive connection structure 523 may include first conductive layers 5231 each disposed on one of upper and lower surfaces of each of the plurality of first redistribution insulating layers 521, and first conductive via patterns 5233 extending in the vertical direction (e.g., the Z direction) through at least one of the plurality of first redistribution insulating layers 521. The first conductive layers 5231 may be disposed at different vertical levels to form a multilayer structure. Each of the first conductive layers 5231 may include a line pattern extending in a line shape on one of the upper and lower surfaces of each of the plurality of first redistribution insulating layers 521. A first conductive layer 5231 provided on the uppermost insulating layer among the plurality of first redistribution insulating layers 521 may include pads to which chip connection bumps 541 for electrical connection with the semiconductor chip 530 are attached, and lower pads to which the vertical connection conductors 550 are connected. The first conductive via patterns 5233 may electrically connect the first conductive layers 5231 disposed at different vertical levels. A first conductive via pattern 5233 provided in the lowermost insulating layer among the plurality of first redistribution insulating layers 521 may be connected to the active antenna pattern 513.

The semiconductor chip 530 may be mounted on the first redistribution structure 520 in a flip chip manner. The semiconductor chip 530 may include an upper surface and a lower surface, which are opposite to each other, and the lower surface of the semiconductor chip 530 may be a pad surface on which a chip pad 531 is provided. The semiconductor chip 530 may be mounted on the first redistribution structure 520 so that the lower surface on which the chip pad 531 is provided faces the first redistribution structure 520. Chip connection bumps 541 such as micro bumps may be disposed between the semiconductor chip 530 and the first redistribution structure 520. The semiconductor chip 530 may be electrically connected to the first conductive connection structure 523 of the first redistribution structure 520 through the chip connection bumps 541.

The semiconductor chip 530 may be substantially the same as or similar to the semiconductor chip 120 described with reference to FIG. 1. In some embodiments, the semiconductor chip 530 is a communication semiconductor chip electrically or signal-transmitably connected to the antenna structure 510, and may include a signal processing circuit for processing a radio signal transmitted or received through the antenna structure 510. For example, the semiconductor chip 530 may include an RFIC chip. In some embodiments, the semiconductor chip 530 may be a memory chip or a logic chip.

In some embodiments, a passive component 545 may be mounted on the first redistribution structure 520. The passive component 545 may be spaced apart from the semiconductor chip 530 in a lateral direction. The passive component 545 may include a capacitor, inductor, resistor, IPD, and the like.

The molding layer 543 may be provided on the first redistribution structure 520 and may cover at least a portion of the semiconductor chip 530 and at least a portion of the passive component 545. In some embodiments, the molding layer 543 may cover the side surface of the semiconductor chip 530 but may not cover the upper surface of the semiconductor chip 530. In this case, the upper surface of the molding layer 543 may be coplanar with the upper surface of the semiconductor chip 530. In other embodiments, the molding layer 543 may cover the upper and side surfaces of the semiconductor chip 530. In addition, the molding layer 543 may fill a gap between the semiconductor chip 530 and the first redistribution structure 520 and may surround the chip connection bump 541 between the semiconductor chip 530 and the first redistribution structure 520. The molding layer 543 may include, for example, an epoxy molding compound, but is not limited thereto.

The vertical connection conductor 550 may be provided in the molding layer 543 and may be spaced apart from the semiconductor chip 530 in the lateral direction. The vertical connection conductor 550 may extend in a substantially vertical direction (e.g., the Z direction) within the molding layer 543 and may pass through the molding layer 543. The vertical connection conductor 550 may have a pillar shape extending in the vertical direction (e.g., the Z direction) within the molding layer 543. The lower surface of the vertical connection conductor 550 may contact the first redistribution structure 520, and the upper surface of the vertical connection conductor 550 may contact the second redistribution structure 560. More specifically, the lower surface of the vertical connection conductor 550 may contact a lower pad of the first conductive layer 5231 on the uppermost insulating layer among the plurality of first redistribution insulating layers 521, and the upper surface of the vertical connection conductor 550 may contact an upper pad of a second conductive layer 5631 in the lowermost insulating layer among a plurality of second redistribution insulating layers 561 to be described below.

The material and dimension (e.g., diameter) of the vertical connection conductor 550 may be substantially the same as or similar to those of the first vertical connection conductor 135 described with reference to FIG. 1. In some embodiments, the vertical connection conductor 550 may include a conductive post formed through a plating process and including Cu, or a conductive wire formed through a bonding wire process.

For example, when the vertical connection conductor 550 includes a conductive wire, an operation of forming a conductive wire on the lower pad of the first conductive layer 5231 on the uppermost first redistribution insulating layer 521 through a bonding wire process, a molding operation of forming a molding material constituting the molding layer 543 covering the semiconductor chip 530 and the conductive wire, a polishing operation of removing a portion of the molding material to expose the conductive wire, and an operation of forming the second redistribution structure 560 on the molding layer 543 may be sequentially performed.

The second redistribution structure 560 may be provided on the molding layer 543 and the semiconductor chip 530. The second redistribution structure 560 may include a plurality of second redistribution insulating layers 561 and a second conductive connection structure 563.

The plurality of second redistribution insulating layers 561 may be provided on the upper surface of the molding layer 543 and may be mutually stacked in the vertical direction (e.g., the Z direction). The plurality of second redistribution insulating layers 561 may include insulating polymer, epoxy, or a combination thereof. In some embodiments, the plurality of second redistribution insulating layers 561 may include a material different from a material constituting the dielectric layer 511. In some embodiments, the dielectric constant of each of the plurality of second redistribution insulating layers 561 may be different from that of the dielectric layer 511.

The second conductive connection structure 563 may include second conductive layers 5631 each disposed on one of upper and lower surfaces of each of the plurality of second redistribution insulating layers 561, and second conductive via patterns 5633 extending in the vertical direction (e.g., the Z direction) through at least one of the plurality of second redistribution insulating layers 561. The second conductive layers 5631 may be disposed at different vertical levels to form a multilayer structure. Each of the second conductive layers 5631 may include a line pattern extending in a line shape on one of the upper and lower surfaces of each of the plurality of second redistribution insulating layers 561. A second conductive layer 5631 provided on the uppermost insulating layer among the plurality of second redistribution insulating layers 561 may constitute an external pad to which an external connection terminal 591 is attached. A second conductive layer 5631 provided in the lowermost insulating layer among the plurality of second redistribution insulating layers 561 may constitute an upper pad connected to the vertical connection conductor 550. The second conductive via patterns 5633 may electrically connect the second conductive layers 5631 disposed at different vertical levels.

In some embodiments, the horizontal width of the upper pad of the second conductive layer 5631 attached to the top of the vertical connection conductor 550 may be equal to or greater than the horizontal width of the lower pad of the first conductive layer 5231 attached to the lower end of the vertical connection conductor 550. For example, the horizontal width of the upper pad of the second conductive layer 5631 may be between 1 time and 10 times or between 3 times and 10 times the horizontal width of the lower pad of the first conductive layer 5231. When the vertical connection conductor 550 includes a conductive wire, the conductive wire may be shifted from a predetermined target position during a molding process for forming the molding layer 543, and the conductive wire may not contact the second conductive layer 5631 due to the shift of the conductive wire. In the present embodiments, by forming the horizontal width of the upper pad of the second conductive layer 5631 to be greater than or equal to the horizontal width of the lower pad of the first conductive layer 5231, the reliability of electrical connection between the vertical connection conductor 550 implemented with a conductive wire and the upper pad of the second conductive layer 5631 may be improved.

The external connection terminal 591 may be attached to the second redistribution structure 560 and may electrically connect the semiconductor package 50 to an external device. For example, the external connection terminal 591 may include a solder ball or a solder bump. A signal (e.g., a data signal, a control signal, a power signal, and/or a ground signal) provided from an external device may be provided to the semiconductor chip 530 through a signal transmission path sequentially passing through the external connection terminal 591, the second conductive connection structure 563 of the second redistribution structure 560, the vertical connection conductor 550, the first conductive connection structure 523 of the first redistribution structure 520, and the chip connection bump 541. In addition, a signal output from the semiconductor chip 530 may be provided to an external device through a signal transmission path sequentially passing through the chip connection bump 541, the first conductive connection structure 523 of the first redistribution structure 520, the vertical connection conductor 550, the second conductive connection structure 563 of the second redistribution structure 560, and the external connection terminal 591.

The vertical connection conductor 550 may include first vertical connection conductors 551 for signal transmission configured to transmit an input signal input to the semiconductor chip 530 or an output signal output from the semiconductor chip 530, and second vertical connection conductors 553 configured to shield EMI to the semiconductor chip 530.

The first vertical connection conductors 551 may be configured to transmit a data signal, a control signal, a power signal, and/or a ground signal transmitted to the semiconductor chip 530, or may be configured to transmit an output signal output from the semiconductor chip 530.

The second vertical connection conductors 553 may be arranged to surround the semiconductor chip 530 in a plan view, and may shield EMI between an external environment and an electronic component such as the semiconductor chip 530 included in the semiconductor package 50. In some embodiments, as shown in FIG. 11, the second vertical connection conductors 553 may be arranged to surround an area including the semiconductor chip 530 and the passive component 545 in a plan view.

In some embodiments, the distance between the first vertical connection conductors 551 and/or the distance between the second vertical connection conductors 553 may be determined according to a frequency band supported by the semiconductor chip 530.

The second vertical connection conductors 553 may be electrically grounded. For example, the second vertical connection conductors 553 may be configured to receive a ground signal through the external connection terminal 591 to which a ground signal (or ground voltage) provided from the outside is applied, the first conductive layer 5231, and the first conductive via pattern 5233. In some embodiments, a ground signal provided from the outside may be applied to the chip pad 531 of the semiconductor chip 530 via at least one of the second vertical connection conductors 553.

Furthermore, the second redistribution structure 560 may include a first conductive shielding layer 569 configured to be electrically grounded and shield EMI to the semiconductor chip 530. The first conductive shielding layer 569 may be disposed on any one of the upper and lower surfaces of each of the plurality of second redistribution insulating layers 561, and may extend parallel to the first surface 511U of the dielectric layer 511. The first conductive shielding layer 569 may have a plane or flat plate shape covering an area where an electronic component such as the semiconductor chip 530 is mounted.

The first conductive shielding layer 569 may be electrically grounded. For example, the first conductive shielding layer 569 may be electrically connected to the second vertical connection conductor 553 that is electrically grounded.

The heat dissipation pad 571 may contact the upper surface of the semiconductor chip 530 and cover at least a portion of the upper surface of the semiconductor chip 530. In some embodiments, the heat dissipation pad 571 may entirely cover the upper surface of the semiconductor chip 530. In some embodiments, the heat dissipation pad 571 may partially cover the upper surface of the semiconductor chip 530.

In some embodiments, the heat dissipation pad 571 may be positioned at the same level as a second conductive layer 5631 positioned at the lowermost layer from among the second conductive layers 5631. For example, the heat dissipation pad 571 may be formed, through a metal interconnect process for forming the second conductive layer 5631 positioned at the lowermost layer from among the second conductive layers 5631, together with the second conductive layer 5631. In this case, the heat dissipation pad 571 may include a material that is the same as that of the second conductive layer 5631. In other embodiments, the heat dissipation pad 571 may be formed in a separate process different from the metal interconnect process for forming the second conductive layer 5631 positioned at the lowermost layer from among the second conductive layers 5631.

In some embodiments, the heat dissipation pad 571 may cover the upper surface of the semiconductor chip 530 and may protrude laterally from the side surface of the semiconductor chip 530 to further cover the upper surface of the molding layer 543. The planar area of the heat dissipation pad 571 may be greater than that of the semiconductor chip 530, and the heat dissipation pad 571 may be formed to cover the entire upper surface of the semiconductor chip 530 and a portion of the upper surface of the molding layer 543 around the semiconductor chip 530 in a plan view.

A plurality of heat dissipation conductive layers 573 and a plurality of heat dissipation via patterns 575, which are thermally coupled to the heat dissipation pad 571, may be provided in the second redistribution structure 560. The plurality of heat dissipation conductive layers 573 may each be disposed on one of upper and lower surfaces of each of the plurality of second redistribution insulating layers 561, and the plurality of heat dissipation via patterns 575 may extend in the vertical direction (e.g., the Z direction) through at least one of the plurality of second redistribution insulating layers 561. The plurality of heat dissipation conductive layers 573 may be disposed at different vertical levels to form a multilayer structure. At least one external heat dissipation terminal 593 may be attached to a heat dissipation conductive layer 573 disposed on the upper surface of the uppermost second redistribution insulating layer 561 from among the plurality of heat dissipation conductive layers 573. The plurality of heat dissipation via patterns 575 may connect heat dissipation conductive layers 573 disposed at different vertical levels. The plurality of heat dissipation conductive layers 573 and the plurality of heat dissipation via patterns 575 may be formed, together with the second conductive layers 5631 and the second conductive via patterns 5633 of the second redistribution structure 560, through a metal interconnect process for forming the second conductive layers 5631 and the second conductive via patterns 5633 of the second redistribution structure 560. Each of the plurality of heat dissipation conductive layers 573 may include a material that is the same as that of the second conductive layer 5631, and each of the plurality of heat dissipation via patterns 575 may include a material that is the same as that of the second conductive via pattern 5633. According to embodiments, heat generated in the semiconductor chip 530 may be quickly discharged to the outside through the heat dissipation pad 571, the plurality of heat dissipation conductive layers 573, and the plurality of heat dissipation via patterns 575, and thus, heat generation issues of the semiconductor chip 530 may be alleviated.

The external heat dissipation terminal 593 may be disposed in a first area of the second redistribution structure 560, and the external connection terminal 591 may be disposed in a second area of the second redistribution structure 560, which is separated from the first area. In some embodiments, the first area of the second redistribution structure 560, in which the external heat dissipation terminal 593 is disposed, may be a central portion of the second redistribution structure 560, and the second area of the second redistribution structure 560, in which the external connection terminal 591 is disposed, may be an outer portion of the second redistribution structure 560. In some embodiments, the second area of the second redistribution structure 560, in which the external connection terminal 591 is disposed, may surround the first area of the second redistribution structure 560, in which the external heat dissipation terminal 593 is disposed, in a plan view.

In some embodiments, the heat dissipation pad 571, the plurality of heat dissipation conductive layers 573, the plurality of heat dissipation via patterns 575, and at least one external heat dissipation terminal 593 may be distinguished from the second conductive connection structure 563 in that they are not electrically connected to the semiconductor chip 530.

In some embodiments, the heat dissipation pad 571, the plurality of heat dissipation conductive layers 573, the plurality of heat dissipation via patterns 575, and the external heat dissipation terminal 593 may be electrically grounded and may constitute a path for transmitting a ground signal to the semiconductor chip 530.

When the heat dissipation pad 571, the plurality of heat dissipation conductive layers 573, and the plurality of heat dissipation via patterns 575 are electrically grounded, the heat dissipation pad 571 and/or the plurality of heat dissipation conductive layers 573 may shield EMI to the semiconductor chip 530, similar to the first conductive shielding layer 569.

In some embodiments, the heat dissipation pad 571 may pass through the plurality of second redistribution insulating layers 561. The heat dissipation pad 571 may be formed to have a thickness similar to the total thickness of the plurality of second redistribution insulating layers 561 and may be exposed to the outside. In this case, the plurality of heat dissipation conductive layers 573, the plurality of heat dissipation via patterns 575, and the external heat dissipation terminal 593 may be omitted.

In some embodiments, the second redistribution structure 560 may include an antenna ground layer 581. The antenna ground layer 581 may have a plane or flat plate shape extending along the surface of any one of the plurality of second redistribution insulating layers 561. For example, the antenna ground layer 581 may extend along the upper surface of a second redistribution insulating layer 561 under the uppermost second redistribution insulating layer 561 among the plurality of second redistribution insulating layers 561. The antenna ground layer 581 may be substantially parallel to each of the active antenna patterns 513, and capacitance may be formed between the antenna ground layer 581 and the active antenna patterns 513. As shown in the cross-sectional view of FIG. 11, the horizontal width of the antenna ground layer 581 may be greater than the horizontal width of each of the active antenna patterns 513. For example, in a plan view, an area where the antenna ground layer 581 is disposed may be larger than an area where the active antenna patterns 513 are disposed. In other words, in a plan view, an area including all of the active antenna patterns 513 may be within an area including the antenna ground layer 581.

The antenna ground layer 581 may be electrically grounded. For example, the antenna ground layer 581 may be configured to receive a ground signal through the external connection terminal 591 to which a ground signal (or ground voltage) provided from the outside is applied, the first conductive layer 5231, and the first conductive via pattern 5233.

The size of the antenna ground layer 581, a vertical distance VD between the antenna ground layer 581 and the active antenna pattern 513, and the dielectric constant of each of the materials provided between the antenna ground layer 581 and the active antenna pattern 513 may affect antenna radiation characteristics using the antenna structure 510.

In some embodiments, the vertical distance VD between the antenna ground layer 581 and the active antenna pattern 513 may be between 200 micrometers and 500 micrometers, or between 300 micrometers and 400 micrometers.

In some embodiments, in order to adjust antenna radiation characteristics, the dielectric constant of material(s) provided between the antenna ground layer 581 and the active antenna pattern 513 may be adjusted. For example, in order to adjust antenna radiation characteristics, the dielectric constant of the first redistribution insulating layer 521, the dielectric constant of the molding layer 543, and/or the dielectric constant of the second redistribution insulating layer 561 may be adjusted.

According to some embodiments of the disclosure, the semiconductor chip 530 has one surface, on which the chip pad 531 is formed and which is disposed toward the antenna structure 510, and the semiconductor chip 530 may be electrically connected to the active antenna pattern 513 of the antenna structure 510 through the first conductive connection structure 523 of the first redistribution structure 520. Accordingly, the length of a signal transmission path between the semiconductor chip 530 and the antenna structure 510 may be reduced, thereby reducing signal loss and improving antenna radiation characteristics.

FIGS. 12A to 12D are cross-sectional views illustrating a method of manufacturing the semiconductor package 50 shown in FIG. 11. Hereinafter, a method of manufacturing the semiconductor package 50 illustrated in FIG. 11 will be described with reference to FIGS. 12A to 12D.

Figure 12A:
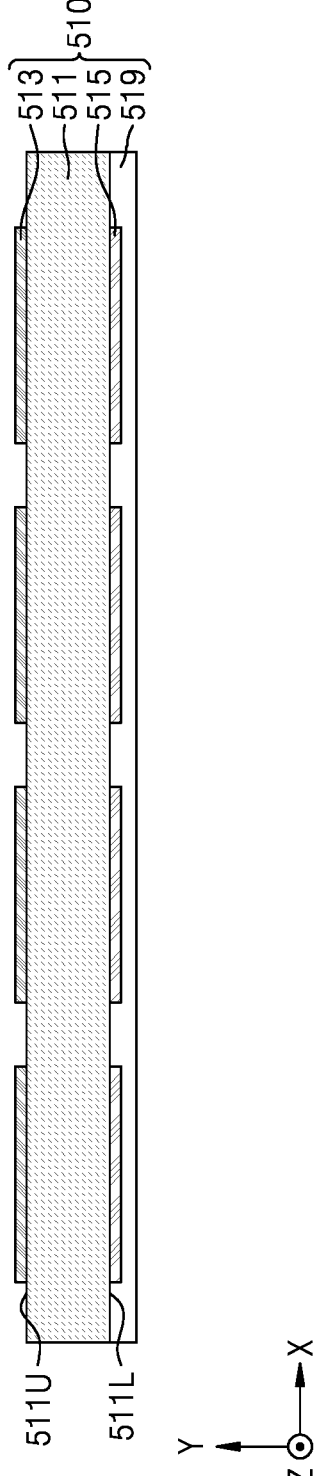
FIGS. 12A to 12D are cross-sectional views illustrating a method of manufacturing the semiconductor package shown in FIG. 11.

Referring to FIG. 12A, an antenna structure 510 is prepared. For example, the antenna structure 510 may be formed through respectively forming an active antenna pattern 513 and a parasitic antenna pattern 515 on the first surface 511U and the second surface 511L of the dielectric layer 511 provided in the form of a film, and forming a protective insulating layer 519 on the second surface 511L of the dielectric layer 511. Optionally, after forming the antenna structure 510, a test process for performance testing of the antenna structure 510 may be performed. A subsequent manufacturing process may be performed on an antenna structure 510 determined to be good in the test process, and an antenna structure 510 determined to be defective in the test process is discarded or repaired to remove defective elements.

Figure 12B:
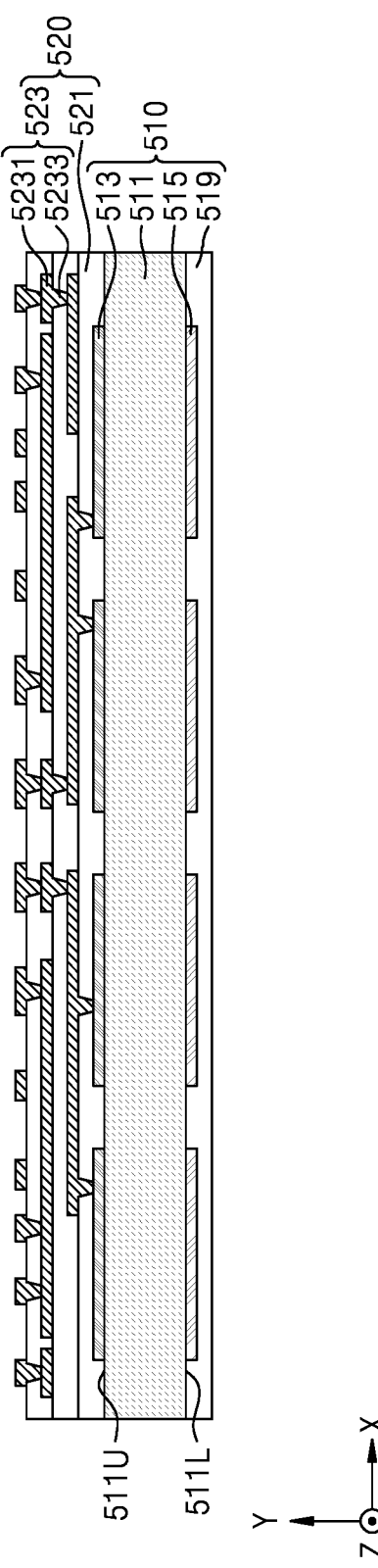

Referring to FIG. 12B, a first redistribution structure 520 is formed on the antenna structure 510. In order to form the first redistribution structure 520, a first operation of forming a first redistribution insulating layer 521 including a via hole, and a second operation of forming a first conductive layer 5231 extending along the upper surface of the first redistribution insulating layer 521 and a first conductive via pattern 5233 in the via hole of the first redistribution insulating layer 521 may be performed, and the first operation and the second operation may be repeated several times.

Figure 12C:
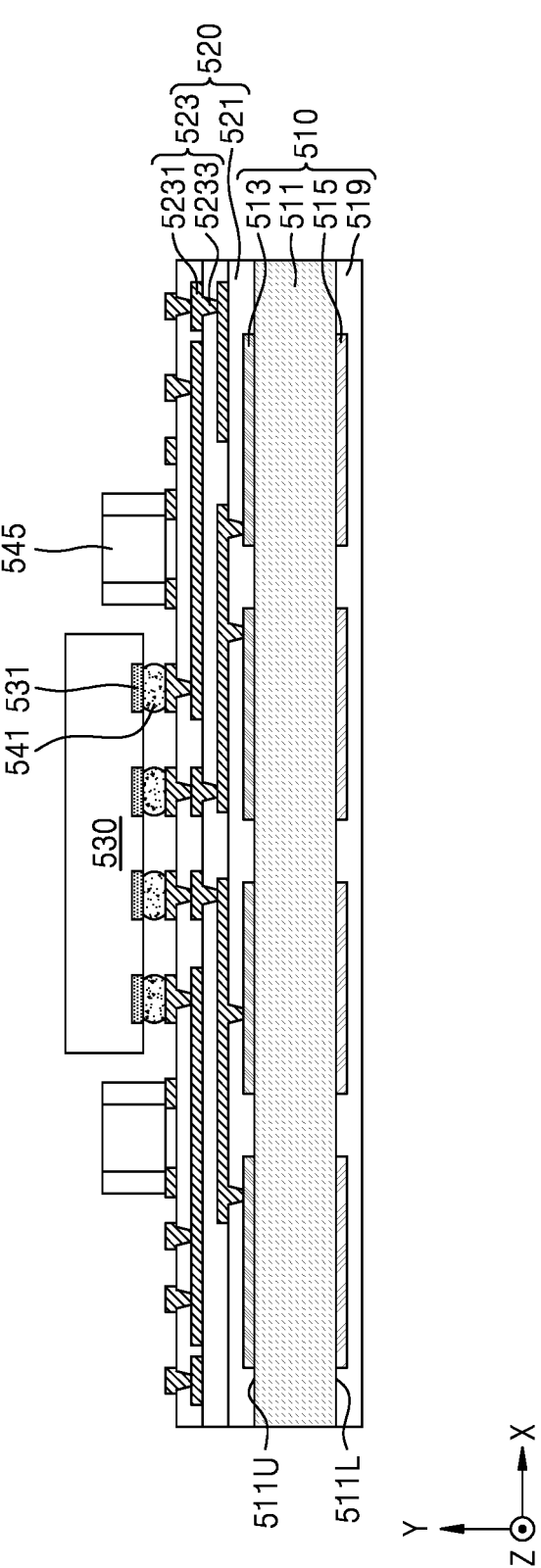

Referring to FIG. 12C, after forming the first redistribution structure 520, a semiconductor chip 530 and a passive component 545 are mounted on the first redistribution structure 520.

Figure 12D:
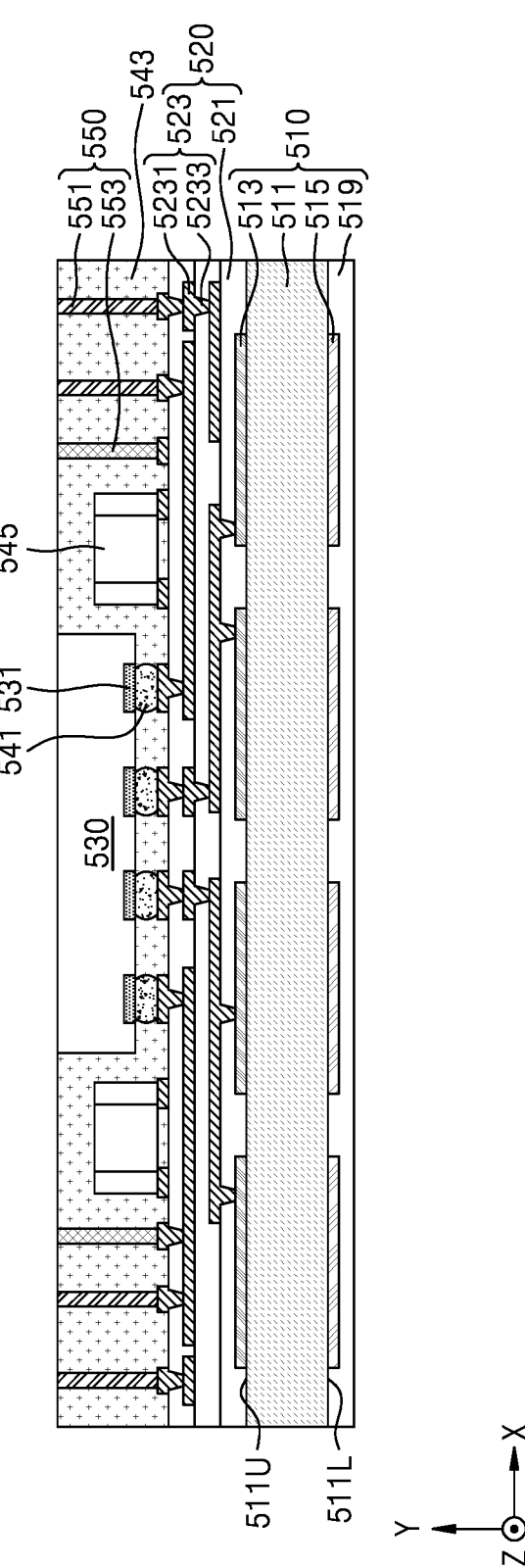

Referring to FIG. 12D, after the semiconductor chip 530 and the passive component 545 are mounted on the first redistribution structure 520, vertical connection conductors 550 and a molding layer 543 are formed on the first redistribution structure 520. For example, after forming the vertical connection conductors 550, a molding material covering the semiconductor chip 530 and the vertical connection conductors 550 may be formed on the first redistribution structure 520, and a polishing process may be performed to remove a portion of the molding material and a portion of the semiconductor chip 530 until the semiconductor chip 530 and the vertical connection conductors 550 are exposed. Another portion of the molding material remaining after the polishing process may constitute the molding layer 543. The polishing process may include a planarization process such as chemical mechanical polishing, and through the polishing process, a portion of the molding material, a portion of the semiconductor chip 530, and a portion of each of the vertical connection conductors 550 may be removed. The upper surface of the molding layer 543, the upper surface of the semiconductor chip 530, and the upper surfaces of the vertical connection conductors 550, obtained through the polishing process, may be planarized surfaces and may be coplanar.

Referring to FIG. 11, after forming the vertical connection conductors 550 and the molding layer 543, a second redistribution structure 560 may be formed on the upper surface of the semiconductor chip 530 and the upper surface of the molding layer 543. A method of forming the second redistribution structure 560 may be substantially the same as or similar to a method of forming the first redistribution structure 520. The heat dissipation pad 571, the heat dissipation conductive layers 573, the heat dissipation via patterns 575, and the antenna ground layer 581 may be formed, through a metal interconnect process for forming the second conductive layers 5631 and the second conductive via patterns 5633 constituting the second conductive connection structure 563 of the second redistribution structure 560, together with the second conductive layers 5631 and the second conductive via patterns 5633. After forming the second redistribution structure 560, an external connection terminal 591 may be formed on the second redistribution structure 560.

Figure 13:
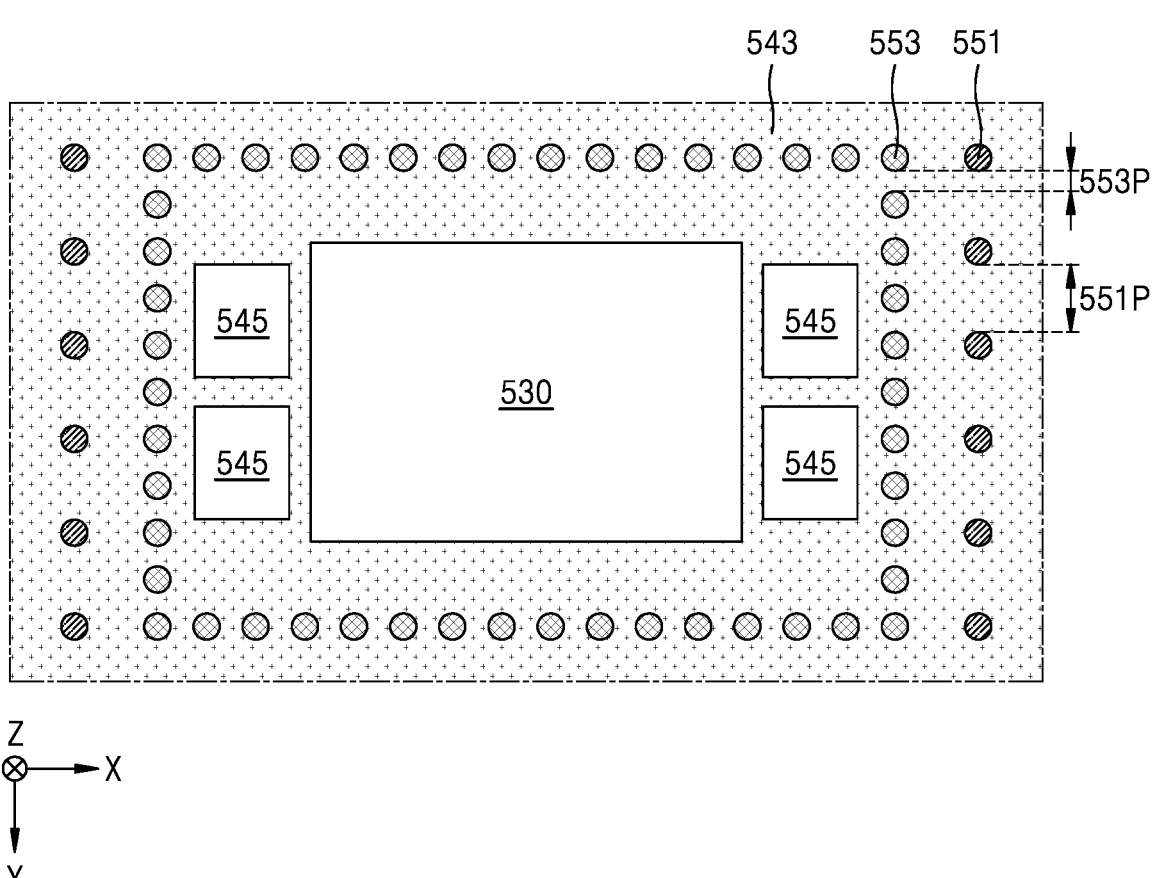
FIG. 13 is a layout diagram showing a configuration of the semiconductor package of FIG. 11.

FIG. 13 is a layout diagram showing a configuration of the semiconductor package 50 of FIG. 11.

Referring to FIG. 13 in addition to FIG. 11, the second vertical connection conductors 553 for electromagnetic wave shielding of the semiconductor chip 530 may be arranged along the edge of the semiconductor chip 530 in a plan view. The second vertical connection conductors 553 may be arranged to surround the semiconductor chip 530 in a plan view. In other words, the second vertical connection conductors 553 may be disposed along an imaginary line, e.g., a quadrangular imaginary line, which surrounds a mounting area where the semiconductor chip 530 is disposed, in a plan view.

As shown in FIG. 13, the second vertical connection conductors 553 may be spaced apart from each other at relatively narrow intervals. In some embodiments, a horizontal distance 553P between the second vertical connection conductors 553 may be less than a horizontal distance 551P between the first vertical connection conductors 551.

FIG. 14 is a layout diagram showing a configuration of a semiconductor package according to some embodiments.

Referring to FIG. 14, second vertical connection conductors 553 may be disposed between a semiconductor chip 530 and a passive component 545. In a plan view, the second vertical connection conductors 553 may be disposed to surround the semiconductor chip 530, and the passive component 545 may be disposed between the second vertical connection conductors 553 and first vertical connection conductors 551.

Figure 15:
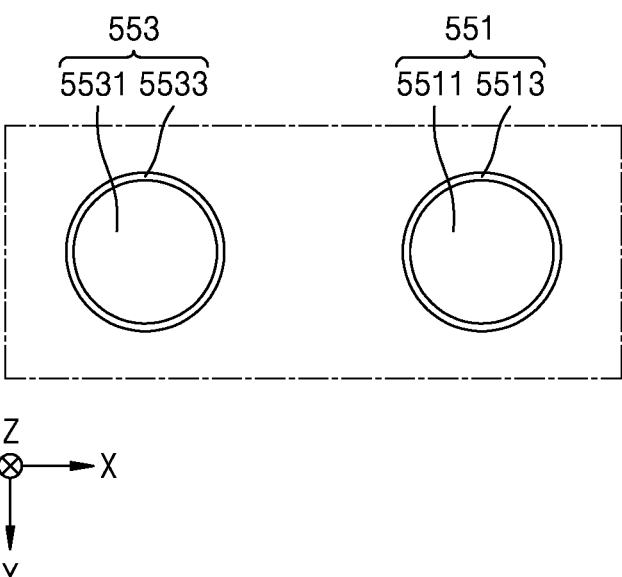
FIG. 15 is a cross-sectional view illustrating a first vertical connection conductor and a second vertical connection conductor of the semiconductor package of FIG. 11.

FIG. 15 is a cross-sectional view illustrating the first vertical connection conductor 551 and the second vertical connection conductor 553 of the semiconductor package 50 of FIG. 11.

Referring to FIG. 15 in addition to FIG. 11, the first vertical connection conductor 551 may include a first core conductor 5511 and a first barrier conductive layer 5513 covering an outer surface of the first core conductor 5511. The first core conductor 5511 may have a pillar shape extending in a vertical direction (e.g., a Z direction) within the molding layer 543. The first barrier conductive layer 5513 may be disposed between the side surface of the first core conductor 5511 and the molding layer 543 and may entirely cover the side surface of the first core conductor 5511. The first barrier conductive layer 5513 may have a cylindrical shape surrounding the side surface of the first core conductor 5511.

The first core conductor 5511 and the first barrier conductive layer 5513 may include different materials. For example, the first core conductor 5511 may include a material having higher electrical conductivity than that of the first barrier conductive layer 5513. For example, the first core conductor 5511 may include Cu, and the first barrier conductive layer 5513 may include Pd.

Also, the second vertical connection conductor 553 may include a second core conductor 5531 and a second barrier conductive layer 5533 covering an outer surface of the second core conductor 5531. The second core conductor 5531 may be substantially the same as the first core conductor 5511, and the second barrier conductive layer 5533 may be substantially the same as the first barrier conductive layer 5513. Therefore, detailed descriptions thereof are omitted.

Figure 16:
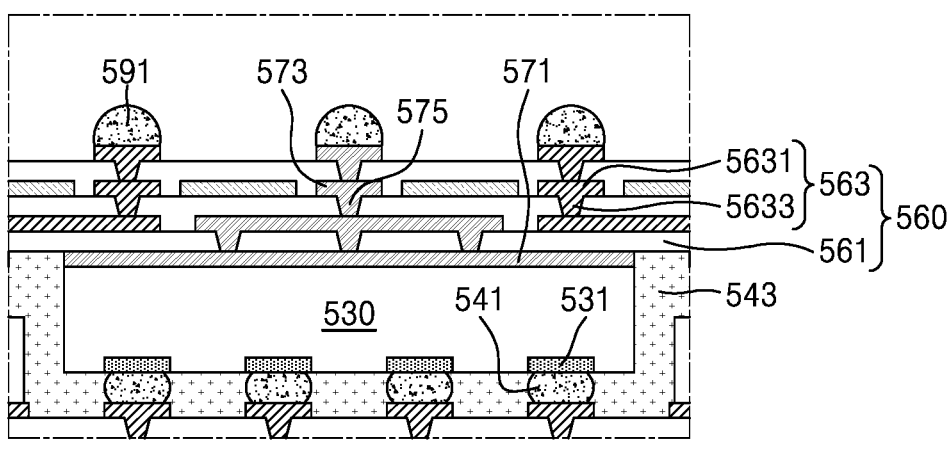
FIG. 16 is a cross-sectional view illustrating a portion of a semiconductor package according to some embodiments.

FIG. 16 is a cross-sectional view illustrating a portion of a semiconductor package according to some embodiments.

Referring to FIG. 16, a heat dissipation pad 571 may be buried in a molding layer 543, and the side surface of the heat dissipation pad 571 may contact the molding layer 543. The upper surface of a semiconductor chip 530 may be positioned at a lower level than the upper surface of the molding layer 543, and the heat dissipation pad 571 may be provided between the upper surface of the semiconductor chip 530 and the upper surface of the molding layer 543.

Figure 17:
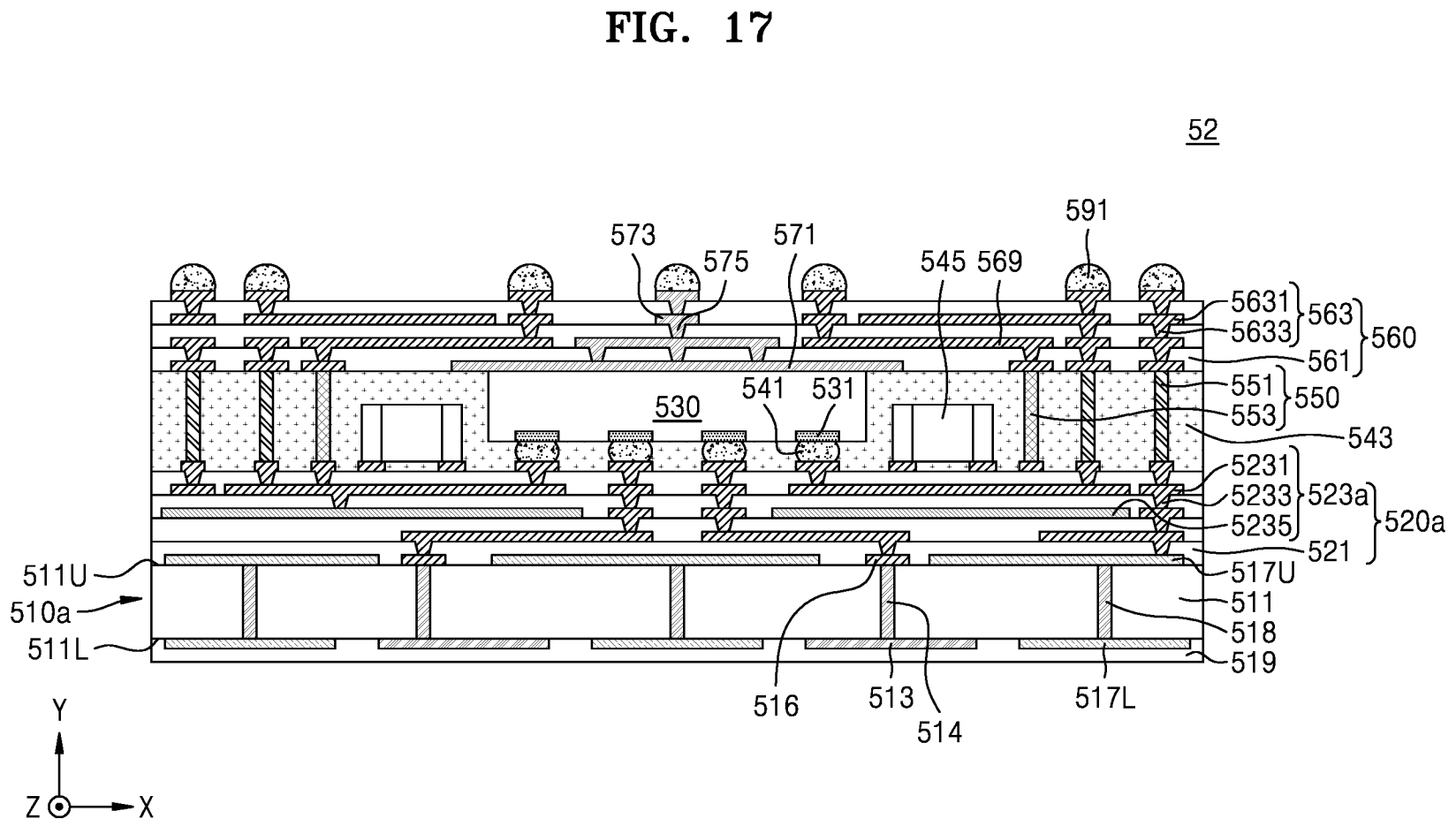

FIG. 17 is a cross-sectional view illustrating a semiconductor package 52 according to some embodiments. Hereinafter, the semiconductor package 52 shown in FIG. 17 will be described, focusing on differences from the semiconductor package 50 described with reference to FIG. 11.

Referring to FIG. 17, the semiconductor package 52 may include an antenna structure 510a, a first redistribution structure 520a, a semiconductor chip 530, a molding layer 543, a vertical connection conductor 550, a second redistribution structure 560, and a heat dissipation pad 571.

The antenna structure 510a may include a dielectric layer 511 having a first surface 511U and a second surface 511L opposite to each other, an active antenna pattern 513 on the second surface 511L of the dielectric layer 511, a connection pad 516 on the first surface 511U of the dielectric layer 511, a first antenna ground layer 517U on the first surface 511U of the dielectric layer 511, and a second antenna ground layer 517L on the second surface 511L of the dielectric layer 511. A protective insulating layer 519 may be disposed on the second surface 511L of the dielectric layer 511 to cover the active antenna pattern 513 and the second antenna ground layer 517L.

The active antenna pattern 513 may be electrically connected to a connection pad 516 on the first surface 511U of the dielectric layer 511 through a first antenna via pattern 514 extending through the dielectric layer 511. The active antenna pattern 513 may be electrically connected to the semiconductor chip 530 through the first antenna via pattern 514, the connection pad 516, a first conductive connection structure 523a, and a chip connection bump 541.

The first antenna ground layer 517U may be disposed on the first surface 511U opposite to the second surface 511L of the dielectric layer 511 on which the active antenna pattern 513 is disposed. The first antenna ground layer 517U may be disposed to face at least a portion of each of the active antenna patterns 513, and capacitance may be formed between the first antenna ground layer 517U and the active antenna patterns 513. The first antenna ground layer 517U may be electrically grounded. The first antenna ground layer 517U may be configured to receive a ground signal through an external connection terminal 591 to which a ground signal (or ground voltage) provided from the outside is applied, a second conductive connection structure 563, a vertical connection conductor 550, and a first conductive connection structure 523a.

In some embodiments, the vertical distance between the first antenna ground layer 517U and the active antenna pattern 513 may be between 200 micrometers and 500 micrometers, or between 300 micrometers and 400 micrometers. In some embodiments, the vertical distance between the first antenna ground layer 517U and the active antenna pattern 513 may be equal to the thickness of the dielectric layer 510a.

The second antenna ground layer 517L may be disposed on the second surface 511L of the dielectric layer 511 on which the active antenna pattern 513 is disposed, and may be spaced apart from the active antenna pattern 513 in a lateral direction. The second antenna ground layer 517L may be electrically grounded and may be electrically connected to the first antenna ground layer 517U through the second antenna via pattern 518 extending through the dielectric layer 511. The second antenna ground layer 517L may be disposed around the active antenna pattern 513 to remove noise signals.

In some embodiments, the horizontal distance between the second antenna ground layer 517L and the active antenna pattern 513 may be 400 micrometers or more. The horizontal distance between the second antenna ground layer 517L and the active antenna pattern 513 may be between 400 micrometers and 1000 micrometers, or between 500 micrometers and 900 micrometers.

In some embodiments, the first redistribution structure 520a may include a second conductive shielding layer 5235. The second conductive shielding layer 5235 may be disposed on any one of upper and lower surfaces of each of the plurality of first redistribution insulating layers 521. The second conductive shielding layer 5235 may be formed, through a metal interconnect process for forming the first conductive layers 5231, together with the first conductive layers 5231 and may be positioned at the same vertical level as any one of the first conductive layers 5231. The second conductive shielding layer 5235 may include the same material as the first conductive layers 5231.

The second conductive shielding layer 5235 may be electrically grounded. For example, the second conductive shielding layer 5235 may be electrically connected to a second vertical connection conductor 553 that is electrically grounded.

The second conductive shielding layer 5235 may extend parallel to the first surface 511U of the dielectric layer 511 and may be disposed between the semiconductor chip 530 and the antenna structure 510a in a vertical direction (e.g., a Z direction) perpendicular to the first surface 511U of the dielectric layer 511. The second conductive shielding layer 5235 may have a plane or flat plate shape that at least partially overlaps an area where an electronic component such as the semiconductor chip 530 is mounted, in a plan view. The second conductive shielding layer 5235 may function as an electromagnetic wave shielding member for electronic components such as the semiconductor chip 530. Furthermore, the conductive shielding layer 5235 may improve antenna gain by reflecting a radio signal radiated from the antenna structure 510a or a radio signal received through the antenna structure 510a.

Figure 18:
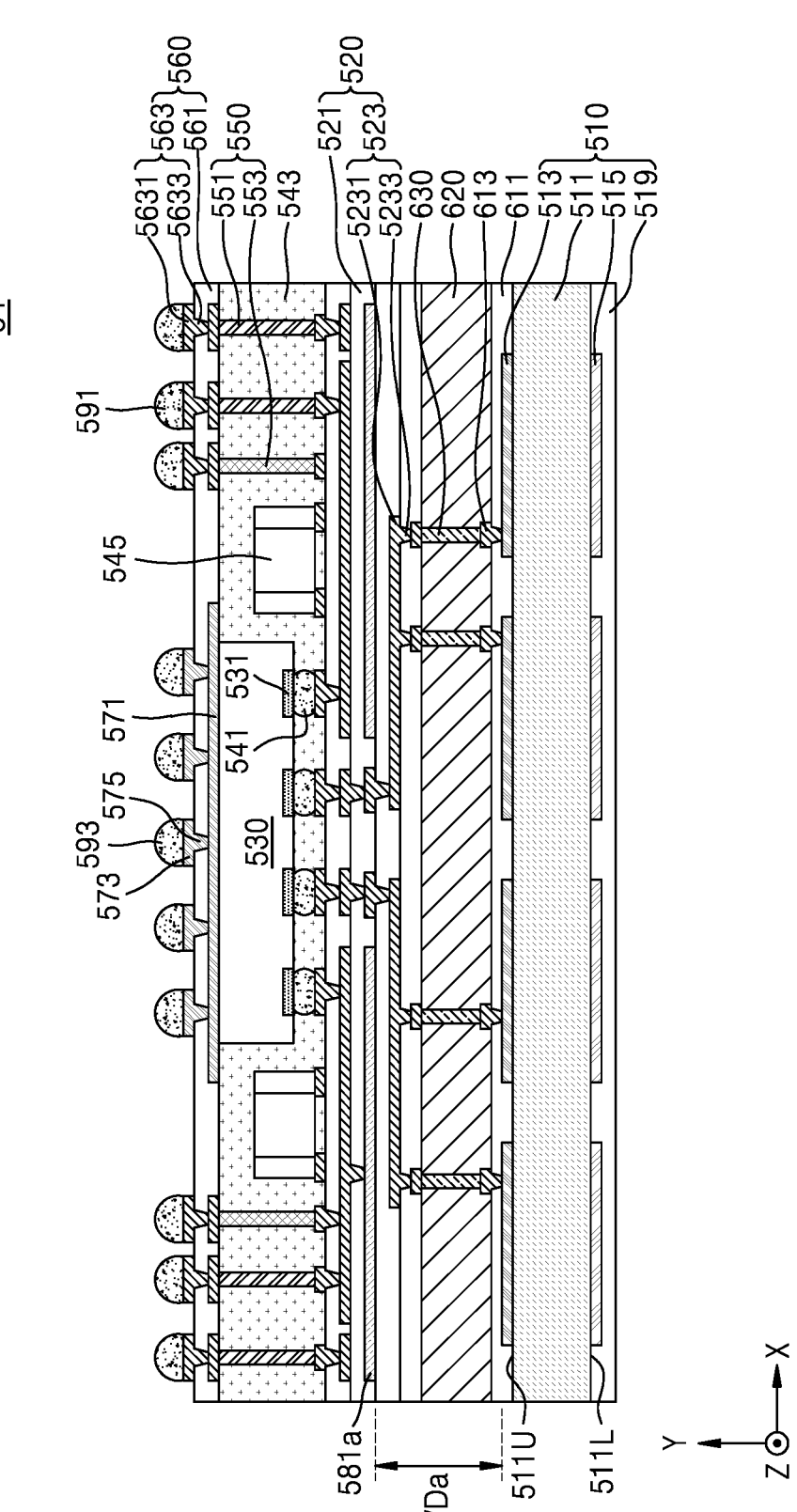
FIG. 18 is a cross-sectional view illustrating a semiconductor package according to some embodiments.

FIG. 18 is a cross-sectional view illustrating a semiconductor package 54 according to some embodiments. Hereinafter, the semiconductor package 54 shown in FIG. 18 will be described, focusing on differences from the semiconductor package 50 described with reference to FIG. 11.

Referring to FIG. 18, the semiconductor package 54 may include an antenna structure 510, a first redistribution structure 520, a semiconductor chip 530, a molding layer 543, a vertical connection conductor 550, a second redistribution structure 560, a heat dissipation pad 571, an upper protective insulating layer 611, a conductive connection pattern 613, a gapping insulating layer 620, and a third vertical connection conductor 630.

The upper protective insulating layer 611 may cover a first surface 511U of a dielectric layer 511 and an active antenna pattern 513. The upper protective insulating layer 611 may include insulating polymer, epoxy, or a combination thereof. In some embodiments, the upper protective insulating layer 611 may include a material different from a material constituting the dielectric layer 511. In some embodiments, the dielectric constant of the upper protective insulating layer 611 may be different from that of the dielectric layer 511.

The conductive connection pattern 613 may electrically connect the active antenna pattern 513 to the third vertical connection conductor 630. The conductive connection pattern 613 may include a pad portion extending along the upper surface of the upper protective insulating layer 611 and a via structure passing through the upper protective insulating layer 611.

The gapping insulating layer 620 may be provided on the upper protective insulating layer 611. The gapping insulating layer 620 may include insulating polymer, epoxy, or a combination thereof. In some embodiments, the gapping insulating layer 620 may include an epoxy molding compound. In some embodiments, the gapping insulating layer 620 may include a material different from a material constituting the dielectric layer 511. In some embodiments, the dielectric constant of the gapping insulating layer 620 may be different from that of the dielectric layer 511.

The third vertical connection conductor 630 may be provided within the gapping insulating layer 620. The third vertical connection conductor 630 may extend in a substantially vertical direction (e.g., a Z direction) within the gapping insulation layer 620 and may pass through the gapping insulation layer 620. The third vertical connection conductor 630 may have a pillar shape extending in the vertical direction (e.g., the Z direction) within the gapping insulating layer 620. The lower surface of the third vertical connection conductor 630 may contact the pad portion of the conductive connection pattern 613, and the upper surface of the third vertical connection conductor 630 may contact an upper pad of the first conductive layer 5631 in the lowermost insulating layer among the plurality of first redistribution insulating layers 521. In the present specification, the third vertical connection conductor 630 may be referred to as a lower vertical connection conductor, and the first vertical connection conductor 551 and the second vertical connection conductor 553 may be referred to as upper vertical connection conductors.

For example, the third vertical connection conductor 630 may include Cu, Al, solder, Sn, Zn, Pb, Ag, Au, Pd, or a combination thereof.

In some embodiments, the diameter (or horizontal width) of the third vertical connection conductor 630 may be between 20 micrometers and 110 micrometers. In some embodiments, the diameter of the third vertical connection conductor 630 may be between 20 micrometers and 50 micrometers, between 50 micrometers and 80 micrometers, or between 80 micrometers and 110 micrometers.

In some embodiments, the third vertical connection conductor 630 may be a conductive post formed through a plating process and including Cu. When the third vertical connection conductor 630 is a conductive post, the third vertical connection conductor 630 may have a diameter of 50 micrometers or more.

In some embodiments, the third vertical connection conductor 630 may include a conductive wire formed through a bonding wire process. When the third vertical connection conductor 630 includes a conductive wire, the diameter of the third vertical connection conductor 630 may be between 20 micrometers and 50 micrometers.

For example, when the third vertical connection conductor 630 includes a conductive wire, an operation of forming a conductive wire extending from the pad portion of the conductive connection pattern 613 through a bonding wire process, an operation of forming an insulating material constituting the gapping insulating layer 620 covering the conductive wire, a polishing operation of removing a portion of the insulating material to expose the conductive wire, and an operation of forming the first redistribution structure 520 on the gapping insulating layer 620 may be sequentially performed.

In some embodiments, the horizontal width of the upper pad of the first conductive layer 5231 attached to the upper end of the third vertical connection conductor 630 may be greater than or equal to the horizontal width of the pad portion of the first conductive connection pattern 613 attached to the lower end of the third vertical connection conductor 630. For example, the horizontal width of the upper pad of the first conductive layer 5231 may be between 1 time and 10 times or between 3 times and 10 times the horizontal width of the pad portion of the first conductive connection pattern 613. When the third vertical connection conductor 630 include a conductive wire, the conductive wire may be shifted from a predetermined target position during a process of forming the gapping insulation layer 620, and the conductive wire may not contact the first conductive layer 5231 due to the shift of the conductive wire. In the present embodiments, by forming the horizontal width of the upper pad of the first conductive layer 5231 to be greater than or equal to the horizontal width of the pad portion of the first conductive connection pattern 613, the reliability of electrical connection between the third vertical connection conductor 630 implemented with a conductive wire and the upper pad of the first conductive layer 5231 may be improved.

In some embodiments, the third vertical connection conductor 630 may include a pillar-shaped core conductor passing through the gapping insulating layer 620 and a barrier conductive layer covering an outer surface of the core conductor, similar to the first vertical connection conductor 551 and/or the second vertical connection conductor 553 described with reference to FIG. 15. Similar to the first vertical connection conductor 551 and/or the second vertical connection conductor 553 described with reference to FIG. 15, the core conductor of the third vertical connection conductor 630 may include a material having higher electrical conductivity than that of the barrier conductive layer of the third vertical connection conductor 630. For example, the core conductor of the third vertical connection conductor 630 may include Cu, and the barrier conductive layer of the third vertical connection conductor 630 may include Pd.

The semiconductor chip 530 may be electrically connected to the active antenna pattern 513 of the antenna structure 510 through the third vertical connection conductor 630, a first conductive connection structure 523 of the first redistribution structure 520, and a chip connection bump 541.

In some embodiments, the active antenna pattern 513 of the antenna structure 510 may include a first active antenna pattern configured to radiate or receive a radio signal in a first wavelength band, and a second active antenna pattern configured to radiate or receive a radio signal in a second wavelength band different from the first wavelength band. The first active antenna pattern and the second active antenna pattern may be electrically connected to the semiconductor chip 530 through different electrical connection paths. The first active antenna pattern and the second active antenna pattern may have different shapes and/or different dimensions (e.g., different horizontal widths).

In some embodiments, the first redistribution structure 520 may include an antenna ground layer 581a. The antenna ground layer 581a may have a plane or flat plate shape extending along the surface of any one of the plurality of first redistribution insulating layers 521. The antenna ground layer 581a may be disposed on any one of upper and lower surfaces of each of the plurality of first redistribution insulating layers 521. The antenna ground layer 581a may be formed, through a metal interconnect process for forming the first conductive layers 5231, together with the first conductive layers 5231 and may be positioned at the same vertical level as any one of the first conductive layers 5231. The antenna ground layer 581a may include the same material as the first conductive layer 5231. For example, the antenna ground layer 581a may extend along the upper surface of any one of the plurality of first redistribution insulating layers 521 and may be positioned between two first conductive layers 5231 spaced apart from each other in a vertical direction.

The antenna ground layer 581a may be substantially parallel to each of the active antenna patterns 513, and capacitance may be formed between the antenna ground layer 581a and the active antenna patterns 513. For example, in a plan view, an area where the antenna ground layer 581a is disposed may be larger than an area where the active antenna patterns 513 are disposed. In other words, in a plan view, an area including all of the active antenna patterns 513 may be within an area including the antenna ground layer 581a.

The antenna ground layer 581a may be electrically grounded. In some embodiments, the antenna ground layer 581a may be configured to receive a ground signal through an external connection terminal 591 to which a ground signal (or ground voltage) provided from the outside is applied, a second vertical connection conductor 553, a first conductive layer 5231, and a first conductive via pattern 5233.

In some embodiments, a vertical distance VDa between the antenna ground layer 581a and the active antenna pattern 513 may be between 200 micrometers and 500 micrometers, or between 300 micrometers and 400 micrometers. The thickness of the gapping insulation layer 620 may be adjusted so that the vertical distance VDa between the antenna ground layer 581a and the active antenna pattern 513 has a required value. In some embodiments, the thickness of the gapping insulation layer 620 may be between 50% and 95% of the vertical distance VDa between the antenna ground layer 581a and the active antenna pattern 513.

FIGS. 19A to 19D are cross-sectional views illustrating a method of manufacturing the semiconductor package 54 shown in FIG. 18. Hereinafter, the method of manufacturing the semiconductor package 54 shown in FIG. 18 will be described with reference to FIGS. 19A to 19D, and descriptions that are the same as those given above will be omitted or simplified.

Figure 19A:
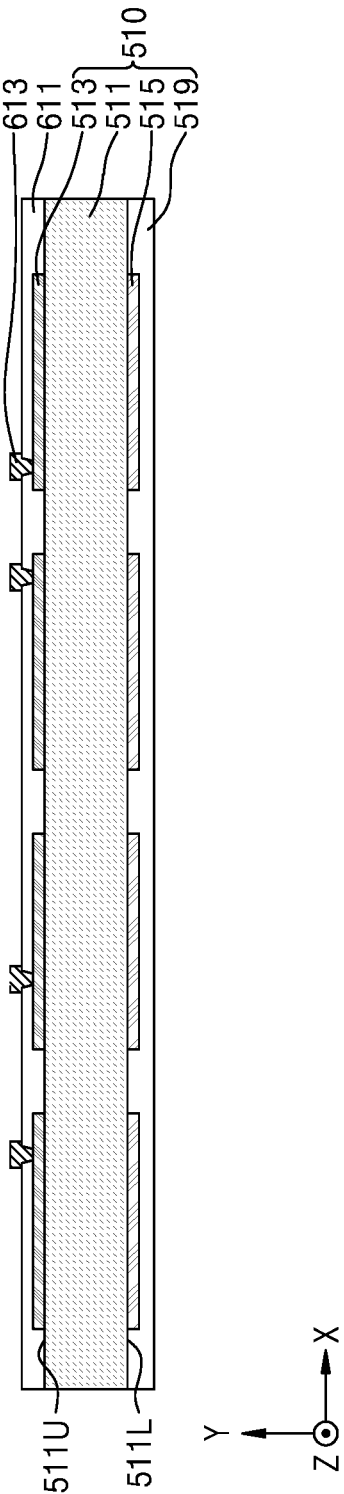
FIGS. 19A to 19D are cross-sectional views illustrating a method of manufacturing the semiconductor package shown in FIG. 18.

Referring to FIG. 19A, an antenna structure 510 is prepared, and an upper protective insulating layer 611 covering the first surface 511U of the dielectric layer 511 and the active antenna pattern 513 is formed on the first surface 511U of the dielectric layer 511. After forming the upper protective insulating layer 611, a conductive connection pattern 613, which includes a pad portion extending along the upper surface of the upper protective insulating layer 611 and a via structure filling a via hole of the upper protective insulating layer 611, is formed The conductive connection pattern 613 may be formed through a metal interconnect process.

Figure 19B:
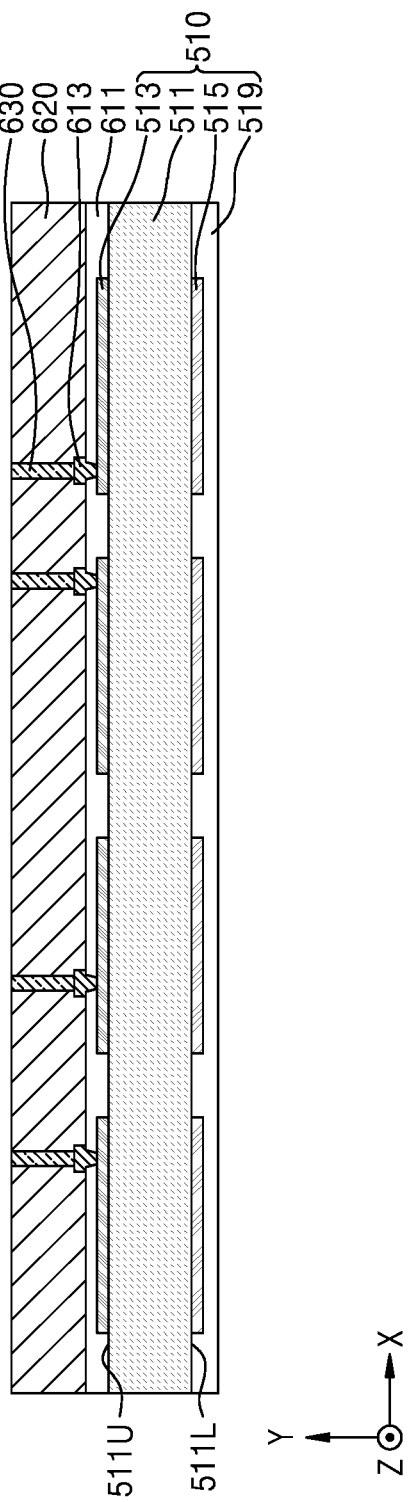

Referring to FIG. 19B, after forming the conductive connection pattern 613, a third vertical connection conductor 630 and a gapping insulating layer 620 are formed on the upper surface of the upper protective insulating layer 611. For example, after forming the third vertical connection conductor 630, an insulating material covering the upper protective insulating layer 611 and the third vertical connection conductor 630 may be formed, and a polishing process may be performed to remove a portion of the insulating material until the third vertical connection conductor 630 is exposed. Another portion of the insulating material remaining after the polishing process may constitute the gapping insulating layer 620. The polishing process may include a planarization process such as chemical mechanical polishing, and through the polishing process, a portion of the insulating material and a portion of each of the third vertical connection conductors 630 may be removed. The upper surface of the gapping insulating layer 620 and the upper surfaces of the third vertical connection conductors 630, obtained through the polishing process, may be planarized surfaces and may be coplanar.

Figure 19C:
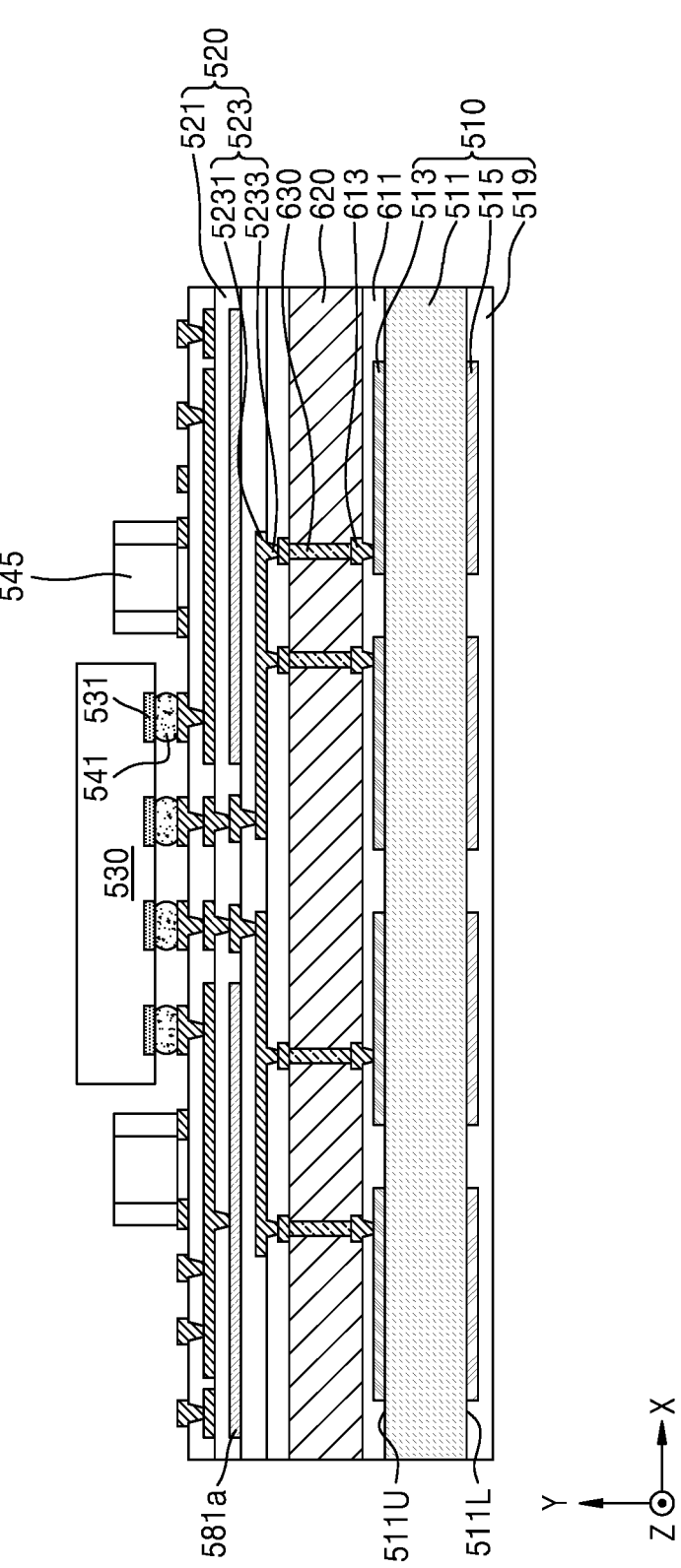

Referring to FIG. 19C, after forming the third vertical connection conductor 630 and the gapping insulating layer 620, a first redistribution structure 520 is formed on the upper surface of the gapping insulating layer 620. After forming the first redistribution structure 520, a semiconductor chip 530 and a passive component 545 are mounted on the first redistribution structure 520.

Figure 19D:
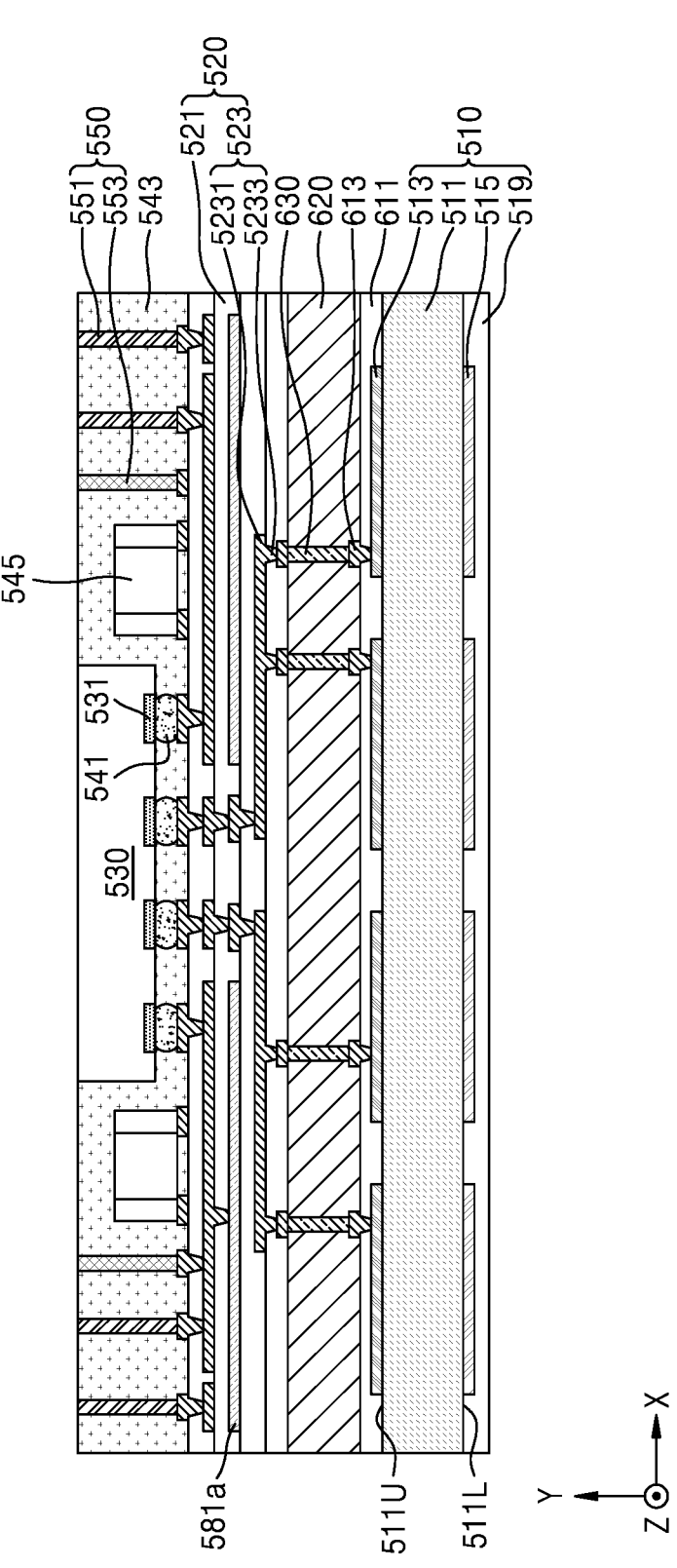

Referring to FIG. 19D, after the semiconductor chip 530 and the passive component 545 are mounted on the first redistribution structure 520, vertical connection conductors 550 and a molding layer 543 are formed on the first redistribution structure 520 through a method similar to that described above with reference to FIG. 12D.

Referring to FIG. 18, after forming the vertical connection conductors 550 and the molding layer 543, a second redistribution structure 560 may be formed on the upper surface of the semiconductor chip 530 and the upper surface of the molding layer 543. After forming the second redistribution structure 560, an external connection terminal 591 may be formed on the second redistribution structure 560.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:
a lower package; and
a first upper package stacked on the lower package,
wherein the lower package includes:
a first redistribution structure including a first redistribution insulating layer and a first conductive layer;
a semiconductor chip mounted on the first redistribution structure;
a first molding layer on the first redistribution structure and surrounding the semiconductor chip; and
first vertical connection conductors disposed on the first redistribution structure and vertically passing through the first molding layer,
wherein the first upper package includes:
a second molding layer disposed on the lower package;
second vertical connection conductors vertically passing through the second molding layer and electrically connected to the first vertical connection conductors; and
a first antenna structure disposed on the second molding layer,
wherein the first antenna structure includes:
active antenna patterns disposed on an upper surface of the second molding layer and extending along the upper surface of the second molding layer;
a lower cover insulating layer disposed on the upper surface of the second molding layer and covering the active antenna patterns;
a dielectric layer disposed on the lower cover insulating layer and separated from the active antenna patterns;
parasitic antenna patterns on the dielectric layer; and
an upper cover insulating layer disposed on the dielectric layer and covering the parasitic antenna patterns,
wherein an antenna ground conductive layer electrically grounded is disposed between the lower package and the second molding layer, a distance in a vertical direction between each of the active antenna patterns and the antenna ground conductive layer is between 100 micrometers and 600 micrometers, and a thickness of the second molding layer in the vertical direction is between 50 micrometers and 400 micrometers.

2. The semiconductor package of claim 1, wherein the first upper package further includes a second redistribution structure disposed between the second molding layer and the lower package,
wherein the second redistribution structure includes a second redistribution insulating layer and a second conductive layer, and
wherein the second conductive layer is electrically connected to the first conductive layer through the first vertical connection conductors, and the antenna ground conductive layer is buried in the second redistribution structure.

3. The semiconductor package of claim 1, wherein the semiconductor chip is mounted on the first redistribution structure through chip connection bumps disposed between chip pads of the semiconductor chip and the first redistribution structure, an upper surface of the semiconductor chip is coplanar with an upper surface of the first molding layer, and the upper surface of the semiconductor chip is exposed to a space between the lower package and the first upper package.

4. The semiconductor package of claim 1, further comprising:

inter-package connection terminals disposed between the lower package and the first upper package; and conductive connecting pillars disposed on chip pads of the semiconductor chip provided on an upper surface of the semiconductor chip and extending from the chip pads of the semiconductor chip to an upper surface of the first molding layer, wherein some of the inter-package connection terminals are connected to the first vertical connection conductors, and some others of the inter-package connection terminals are connected to the conductive connection pillars.

5. The semiconductor package of claim 1, wherein a horizontal width of the lower package is greater than a horizontal width of the first upper package, and a portion of the lower package protrudes in a lateral direction from a sidewall of the first upper package.

6. The semiconductor package of claim 5, further comprising a passive component disposed on the first molding layer of the lower package and spaced apart from the first upper package in the lateral direction.

7. The semiconductor package of claim 5, further comprising:

inter-package connection terminals disposed between the lower package and the first upper package; and an underfill layer disposed between the lower package and the first upper package and surrounding the inter-package connection terminals.

8. The semiconductor package of claim 1, further comprising an anisotropic conductive layer disposed between the lower package and the first upper package.

9. The semiconductor package of claim 1, further comprising a ground conductive layer extending along an upper surface of the semiconductor chip and electrically grounded, wherein the upper surface of the semiconductor chip is coplanar with an upper surface of the first molding layer.

10. The semiconductor package of claim 1, wherein the lower package further includes a third redistribution structure disposed between the first molding layer and the second molding layer, wherein the third redistribution structure includes a third redistribution insulating layer and a third conductive layer, and wherein the third conductive layer is electrically connected to the first vertical connection conductors and the second vertical connection conductors.

11. The semiconductor package of claim 1, further comprising a second upper package stacked on the lower package to be spaced apart from the first upper package in a lateral direction, wherein the second upper package includes a second antenna structure configured to radiate or receive a radio signal in a different wavelength band than the first antenna structure.

12. A semiconductor package comprising:

an antenna structure including a dielectric layer and an active antenna pattern on a first surface of the dielectric layer;

a gapping insulating layer provided on the first surface of the dielectric layer;

a lower vertical connection conductor passing through the gapping insulating layer and electrically connected to the active antenna pattern;

a first redistribution structure provided on the gapping insulation layer and including a plurality of first conductive layers electrically connected to the active antenna pattern through the lower vertical connection conductor and an antenna ground layer electrically grounded;

a semiconductor chip mounted on the first redistribution structure and electrically connected to the active antenna pattern through the plurality of first conductive layers and the lower vertical connection conductor;

a molding layer provided on the first redistribution structure and surrounding a side surface of the semiconductor chip;

upper vertical connection conductors spaced apart from the semiconductor chip in a lateral direction and passing through the molding layer; and a second redistribution structure provided on the molding layer and the semiconductor chip and including a second conductive layer connected to the upper vertical connection conductors, wherein a first conductive layer disposed closest to the lower vertical connection conductor among the plurality of first conductive layers is disposed on the gapping insulating layer and is directly connected to the lower vertical connection conductor.

13. The semiconductor package of claim 12, wherein the lower vertical connecting conductor includes a conductive wire that penetrates the gapping insulating layer.

14. The semiconductor package of claim 12, wherein the upper vertical connection conductors include:

first upper vertical connection conductors for signal transmission configured to transmit a signal input to the semiconductor chip or a signal output from the semiconductor chip; and second upper vertical connection conductors electrically grounded and configured to shield electromagnetic interference to the semiconductor chip.

15. The semiconductor package of claim 14, wherein a horizontal distance between the second upper vertical connection conductors is less than a horizontal distance between the first upper vertical connection conductors.

16. The semiconductor package of claim 12, further comprising a heat dissipation pad at least partially covering one surface of the semiconductor chip.

17. The semiconductor package of claim 16, further comprising:

an external heat dissipation terminal provided on a first area of the second redistribution structure and connected to the heat dissipation pad through a heat dissipation conductive layer and a heat dissipation via pattern, provided in the second redistribution structure; and an external connection terminal provided on a second area of the second redistribution structure surrounding the first area of the second redistribution structure in a plan view, the external connection terminal being connected to the second conductive layer.

18. The semiconductor package of claim 12, wherein a thickness of the dielectric layer is between 100 micrometers and 300 micrometers.

19. The semiconductor package of claim 12, wherein the first redistribution structure includes a redistribution insulating layer provided on the gapping insulating layer, and wherein the redistribution insulating layer includes a material different from that of the dielectric layer.

* * * * *